US012771323B2

(12) United States Patent
Inoue

(10) Patent No.: US 12,771,323 B2
(45) Date of Patent: Oct. 20, 2026

(54) ACOUSTIC WAVE DEVICE AND COMPOSITE FILTER DEVICE

(71) Applicant: Murata Manufacturing Co., Ltd., Nagaokakyo (JP)

(72) Inventor: Kazunori Inoue, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 173 days.

(21) Appl. No.: 18/736,605

(22) Filed: Jun. 7, 2024

(65) Prior Publication Data

US 2024/0322793 A1 Sep. 26, 2024

Related U.S. Application Data

(63) Continuation of application No. PCT/JP2022/046293, filed on Dec. 15, 2022.

(Continued)

(51) Int. Cl.

*H03H 9/58* (2006.01)
*H03H 9/02* (2006.01)

(Continued)

(52) U.S. Cl.

CPC ........ *H03H 9/585* (2013.01); *H03H 9/02031* (2013.01); *H03H 9/02118* (2013.01);

(Continued)

(58) Field of Classification Search

CPC ............... H03H 9/585; H03H 9/02031; H03H 9/02118; H03H 9/02157; H03H 9/02228;

(Continued)

(56) References Cited

U.S. PATENT DOCUMENTS

2007/0115079 A1 5/2007 Kubo et al.
2007/0267942 A1 11/2007 Matsumoto et al.

(Continued)

FOREIGN PATENT DOCUMENTS

JP 2007312164 A 11/2007
JP 2011130385 A 6/2011

(Continued)

OTHER PUBLICATIONS

International Search Report in PCT/JP2022/046293, mailed Mar. 14, 2023, 3 pages.

(Continued)

*Primary Examiner* — Jorge L Salazar, Jr.
(74) *Attorney, Agent, or Firm* — Keating & Bennett, LLP

(57) ABSTRACT

An acoustic wave device includes a first piezoelectric layer including a first main surface and a second main surface, a first support portion including a first support substrate that overlaps the first piezoelectric layer in a first direction, a first resonator provided on at least the first main surface of the first piezoelectric layer, a second piezoelectric layer including a third main surface and a fourth main surface, a second support portion including a second support substrate overlapping the second piezoelectric layer in the first direction, and a second resonator provided on at least the third main surface of the second piezoelectric layer. The first resonator and the second resonator each include a functional electrode. The support portion includes a space portion that overlaps at least a portion of the functional electrode of the resonator in a plan view in the first direction.

31 Claims, 14 Drawing Sheets

Related U.S. Application Data

(60) Provisional application No. 63/289,971, filed on Dec. 15, 2021.

(51) Int. Cl.

*H03H 9/17* (2006.01)
*H03H 9/60* (2006.01)
*H03H 9/70* (2006.01)

(52) U.S. Cl.

CPC .... *H03H 9/02157* (2013.01); *H03H 9/02228* (2013.01); *H03H 9/173* (2013.01); *H03H 9/176* (2013.01); *H03H 9/581* (2013.01); *H03H 9/587* (2013.01); *H03H 9/605* (2013.01); *H03H 9/703* (2013.01)

(58) Field of Classification Search

CPC ........ H03H 9/173; H03H 9/176; H03H 9/581; H03H 9/587; H03H 9/605; H03H 9/703; H03H 9/02574; H03H 9/25; H03H 9/145

USPC ......................... 333/133, 187, 188, 193–196

See application file for complete search history.

(56) References Cited

U.S. PATENT DOCUMENTS

| | | | | |
|---|---|---|---|---|
| 2011/0006860 | A1 | 1/2011 | Hara et al. | |
| 2011/0146041 | A1 | 6/2011 | Miyake et al. | |
| 2012/0306593 | A1 | 12/2012 | Kidoh | |
| 2015/0263697 | A1 * | 9/2015 | Zhang .................. | H10N 30/852 310/346 |
| 2017/0346463 | A1 | 11/2017 | Hatakeyama et al. | |
| 2017/0373668 | A1 | 12/2017 | Nishihara et al. | |

FOREIGN PATENT DOCUMENTS

| | | | |
|---|---|---|---|
| JP | 2017212628 | A | 11/2017 |
| JP | 2017228946 | A | 12/2017 |
| WO | 2006008940 | A1 | 1/2006 |
| WO | 2009110062 | A1 | 9/2009 |
| WO | 2011102049 | A1 | 8/2011 |

OTHER PUBLICATIONS

Written Opinion in PCT/JP2022/046293, mailed Mar. 14, 2023, 4 pages.

* cited by examiner

ACOUSTIC WAVE DEVICE AND COMPOSITE FILTER DEVICE

CROSS REFERENCE TO RELATED APPLICATIONS

This application claims the benefit of priority to Provisional Application No. 63/289,971, filed on Dec. 15, 2021, and is a Continuation Application of PCT Application No. PCT/JP2022/046293, filed on Dec. 15, 2022. The entire contents of each application are hereby incorporated herein by reference.

BACKGROUND OF THE INVENTION

1. Field of the Invention

The present disclosure relates to acoustic wave devices and composite filter devices.

2. Description of the Related Art

Japanese Unexamined Patent Application Publication No. 2007-312164 describes an acoustic wave device. The acoustic wave device includes a support substrate including a space portion, a piezoelectric layer, and an IDT electrode. The piezoelectric layer is provided on the support substrate to overlap the space portion, and the IDT electrode is provided on the piezoelectric layer to overlap the space portion.

In some cases, an acoustic wave device as a filter may be provided using a plurality of acoustic wave resonators disclosed in Japanese Unexamined Patent Application Publication No. 2007-312164. In this case, the leakage wave generated from one resonator may be reflected from a portion of the support substrate where the space portion is not provided and may propagate to another resonator, whereby ripples may be generated in the other resonator. In this case, when the ripple is generated in the pass band of the other resonator, there is a possibility that the frequency characteristics of the acoustic wave device are significantly deteriorated. Therefore, it is required to differentiate the thickness of the support substrate for each resonator. However, in a case where the thickness of the support substrate is differentiated for each element, when the acoustic wave device is picked up by a tape feeder and mounted on the module substrate, complicated pickup work is required, and there is a possibility that the work of mounting the acoustic wave device on the module substrate becomes difficult.

SUMMARY OF THE INVENTION

Example embodiments of the present invention provide acoustic wave devices that each simplify the pickup work and facilitate mounting on a module substrate while deterioration of frequency characteristics due to ripples is reduced or prevented, and composite filter devices that are able to improve filter characteristics.

An acoustic wave device according to an example embodiment of the present invention includes a first piezoelectric layer including a first main surface and a second main surface opposite to the first main surface in a first direction, a first support portion including a first support substrate that overlaps the first piezoelectric layer in the first direction, a first resonator provided on at least the first main surface of the first piezoelectric layer, a second piezoelectric layer including a third main surface and a fourth main surface opposite to the third main surface in the first direction, a second support portion including a second support substrate that overlaps the second piezoelectric layer in the first direction, and a second resonator provided on at least the third main surface of the second piezoelectric layer. The first resonator and the second resonator each include a functional electrode. The first support portion includes a space portion that overlaps at least a portion of the functional electrode of the first resonator in a plan view in the first direction. The second support portion includes a space portion that overlaps at least a portion of the functional electrode of the second resonator in the plan view in the first direction. A main surface of the first support substrate on a first piezoelectric layer side and a main surface of the second support substrate on a second piezoelectric layer side oppose each other in the first direction. The first resonator and the second resonator are electrically connected by a conductive joining portion extending in the first direction. A space between the first support substrate and the second support substrate is sealed by a sealing portion. The first support substrate and the second support substrate have different thicknesses.

A composite filter device according to an example embodiment of the present invention includes an acoustic wave device according to an example embodiment of the present invention, which is connected to an antenna, and at least one acoustic wave device that is connected in common to the antenna terminal.

A composite filter device according to an example embodiment of the present invention includes a plurality of acoustic wave devices connected in common to an antenna terminal connected to an antenna via a switch. At least one of the plurality of acoustic wave devices is an acoustic wave device according to an example embodiment of the present invention.

According to example embodiments of the present invention, it is possible to simplify the pickup work and facilitate mounting on the module substrate while the deterioration of the acoustic wave device due to ripples is reduced or prevented.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Hereinafter, example embodiments of the present invention will be described in detail based on the drawings. The present disclosure is not limited by the example embodiments. Each example embodiment described in the present disclosure is exemplary, and in modified examples and second and subsequent example embodiments in which configurations can be partially replaced or combined between different example embodiments, descriptions of matters common to the first example embodiment will be omitted, and only differences will be described. Particularly, similar actions and advantageous effects achieved by the same or similar configurations will not be repeatedly described in each example embodiment.

First Example Embodiment

Figure 1A:
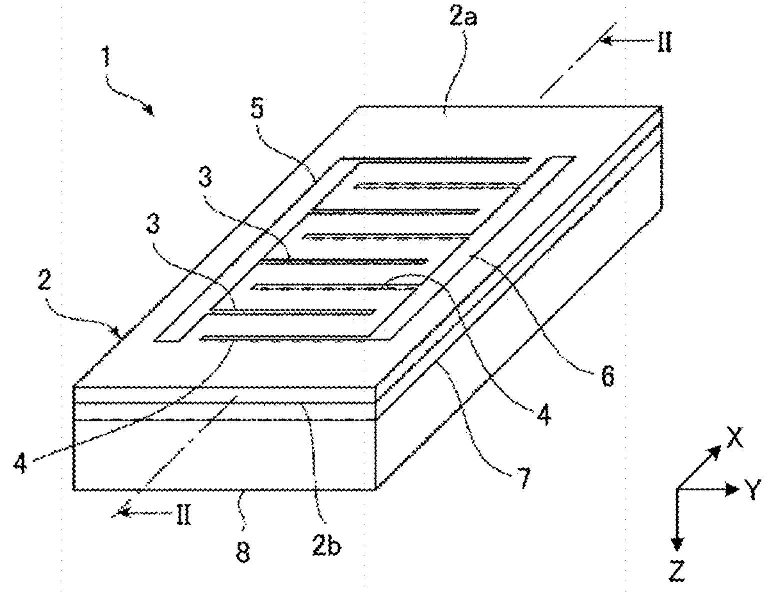
FIG. 1A is a perspective view illustrating an acoustic wave device of an example embodiment of the present invention.
Figure 1B:
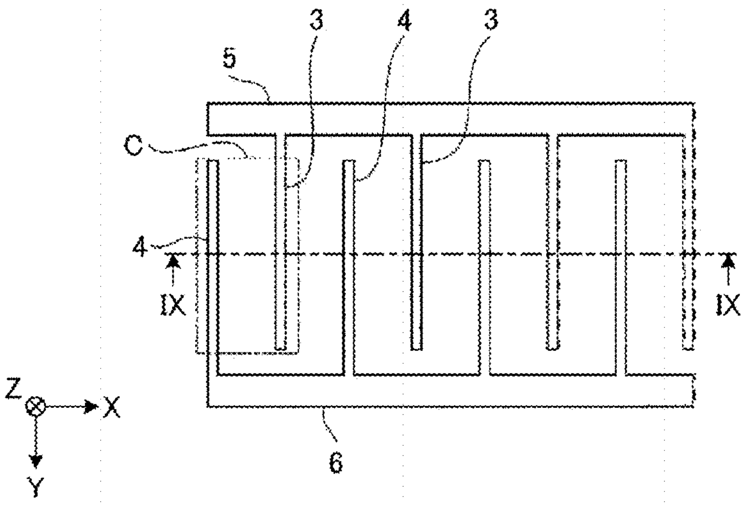
FIG. 1B is a plan view illustrating an electrode structure of an example embodiment of the present invention.

FIG. 1A is a perspective view illustrating an acoustic wave device of a first example embodiment of the present invention. FIG. 1B is a plan view illustrating an electrode structure of the first example embodiment.

An acoustic wave device 1 of the first example embodiment includes a piezoelectric layer 2 made of, for example, $LiNbO_3$. The piezoelectric layer 2 may alternatively be made of, for example, $LiTaO_3$. The cut-angle of $LiNbO_3$ or $LiTaO_3$ is a Z cut in the first example embodiment. The cut-angle of $LiNbO_3$ or $LiTaO_3$ may be a rotational Y cut or an X cut. Preferably, a propagation orientation of, for example, about ±30° For Y propagation and X propagation is preferred.

The thickness of the piezoelectric layer 2 is not particularly limited, but is, for example, preferably about 50 nm or more and about 1000 nm or less in order to effectively excite the first-order thickness shear mode.

The piezoelectric layer 2 includes a first main surface 2*a* and a second main surface 2*b* that oppose each other in the Z direction. An electrode finger 3 and an electrode finger 4 are provided on the first main surface 2*a*.

Here, the electrode finger 3 is an example of the "first electrode finger" and the electrode finger 4 is an example of the "second electrode finger". In FIGS. 1A and 1B, a plurality of electrode fingers 3 are a plurality of "first electrode fingers" connected to a first busbar electrode 5. A plurality of electrode fingers 4 are a plurality of "second electrode fingers" connected to a second busbar electrode 6. The plurality of electrode fingers 3 and the plurality of electrode fingers 4 are interdigitated with each other. As a result, an interdigital transducer (IDT) electrode including the electrode fingers 3, the electrode fingers 4, the first busbar electrode 5, and the second busbar electrode 6 is configured.

Each of the electrode fingers 3 and the electrode fingers 4 has a rectangular or substantially rectangular shape and a length direction. The electrode finger 3 and the electrode finger 4 adjacent to the electrode finger 3 oppose each other in a direction orthogonal or substantially orthogonal to the length direction. The length direction of the electrode fingers 3 and 4 and the direction orthogonal or substantially orthogonal to the length direction of the electrode fingers 3 and 4 are directions that intersect the thickness direction of the piezoelectric layer 2. Therefore, it can be said that the electrode finger 3 and the electrode finger 4 adjacent to the electrode finger 3 oppose each other in a direction that intersects the thickness direction of the piezoelectric layer 2. In the following description, the thickness direction of the piezoelectric layer 2 may be referred to as a Z direction (or first direction), the length direction of the electrode finger 3 and the electrode finger 4 may be referred to as a Y direction (or second direction) , and the direction orthogonal to the electrode finger 3 and the electrode finger 4 may be referred to as an X direction (or a third direction) . Here, the X direction and the Y direction are directions parallel to the plane of the piezoelectric layer 2.

Alternatively, the length direction of the electrode finger 3 and the electrode finger 4 may be replaced with the direction orthogonal or substantially orthogonal to the length direction of the electrode finger 3 and the electrode finger 4 illustrated in FIGS. 1A and 1B. That is, in FIGS. 1A and 1B, the electrode finger 3 and the electrode finger 4 may extend in the direction in which the first busbar electrode 5 and the second busbar electrode 6 extend. In that case, the first busbar electrode 5 and the second busbar electrode 6 extend in the direction in which the electrode finger 3 and the electrode finger 4 extend in FIGS. 1A and 1B. A plurality of pairs of the electrode fingers 3 connected to one potential and the electrode fingers 4 connected to the other potential, each of the pairs consisting of the electrode finger 3 and the electrode finger 4 adjacent to each other, are provided in the direction orthogonal to the length direction of the electrode finger 3 and the electrode finger 4.

Here, the case where the electrode finger 3 and the electrode finger 4 are adjacent to each other does not indicate that the electrode finger 3 and the electrode finger 4 are in direct contact with each other, but that the electrode finger 3 and the electrode finger 4 are provided with a gap therebetween. In addition, when the electrode finger 3 and the electrode finger 4 are adjacent to each other, between the electrode finger 3 and the electrode finger 4, the electrode including other electrode fingers 3 and 4 and connected to the hot electrode or the ground electrode is not disposed. The number of pairs need not be an integer, and may be, for example, 1.5 or 2.5.

A center-to-center distance, that is, a pitch between the electrode finger 3 and the electrode finger 4 is, for example, preferably in a range of about 1 μm or more and about 10 μm or less. In addition, the center-to-center distance between the electrode finger 3 and the electrode finger 4 is a distance between the center of the width dimension of the electrode finger 3 in the direction orthogonal to the length direction of the electrode finger 3 and the center of the width dimension of the electrode finger 4 in the direction orthogonal or substantially orthogonal to the length direction of the electrode finger 4.

Further, when at least one of the electrode finger 3 and the electrode finger 4 includes a plurality of electrode fingers (when there are 1.5 or more electrode sets, each consisting of the electrode finger 3 and the electrode finger 4), the center-to-center distance between the electrode finger 3 and the electrode finger 4 indicates an average value of the center-to-center distances between adjacent ones of the 1.5 or more pairs of electrode fingers 3 and 4.

Moreover, the width of the electrode finger 3 and electrode finger 4, that is, the dimension in the facing direction of the electrode finger 3 and the electrode finger 4 is, for example, preferably in the range of about 150 nm or more and about 1000 nm or less. In addition, the center-to-center distance between the electrode finger 3 and the electrode finger 4 is a distance between the center of the dimension (width dimension) of the electrode finger 3 in the direction orthogonal or substantially orthogonal to the length direction of the electrode finger 3 and the center of the dimension (width dimension) of the electrode finger 4 in the direction orthogonal to the length direction of the electrode finger 4.

In addition, in the first example embodiment, since the Z-cut piezoelectric layer is used, the direction orthogonal or substantially orthogonal to the length direction of the electrode finger 3 and the electrode finger 4 is the direction orthogonal or substantially orthogonal to a polarization direction of the piezoelectric layer 2. This is not the case when a piezoelectric material having a different cut-angle is used as the piezoelectric layer 2. Here, "orthogonal" is not limited to being strictly orthogonal, but may be substantially orthogonal (an angle between the direction orthogonal to the length direction of the electrode finger 3 and the electrode finger 4 and the polarization direction is, for example, about 90°±10°).

Figure 2:
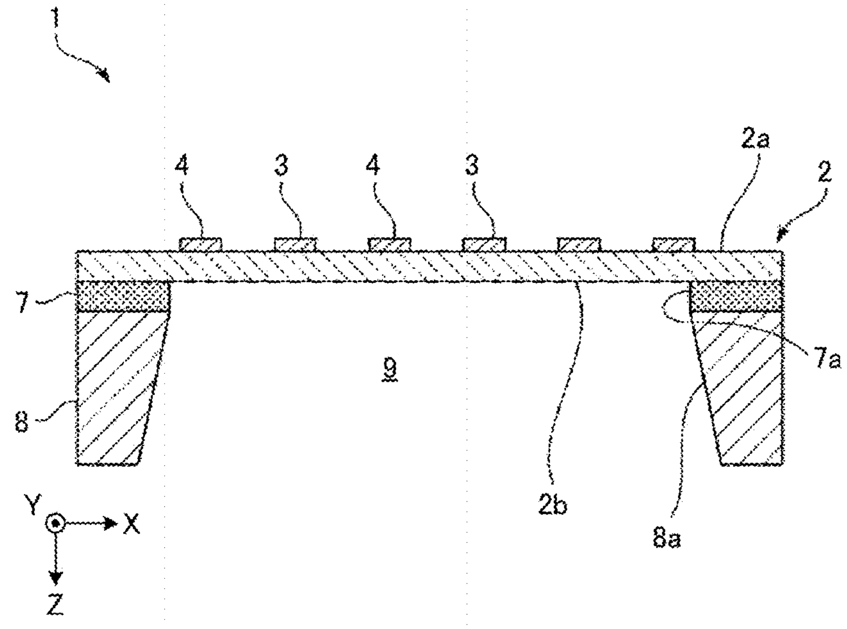
FIG. 2 is a sectional view of a part taken along line II-II in FIG. 1A.

A support substrate 8 is preferably laminated on the second main surface 2*b* side of the piezoelectric layer 2 with an intermediate layer 7 interposed therebetween. The intermediate layer 7 and the support substrate 8 have a frame shape and, as illustrated in FIG. 2, includes cavities 7*a* and 8*a*. As a result, a space portion (air gap) 9 is provided.

The space portion 9 is provided not to disturb the vibration of an excitation region C of the piezoelectric layer 2. Therefore, the support substrate 8 is preferably laminated on the second main surface 2*b* with the intermediate layer 7 interposed therebetween at a position not overlapping the portion where at least one pair of electrode finger 3 and the electrode finger 4 is provided. Note that the intermediate layer 7 does not necessarily need to be provided. Therefore, the support substrate 8 can be directly or indirectly laminated to the second main surface 2*b* of the piezoelectric layer 2.

The intermediate layer 7 is preferably made of silicon oxide, for example. However, in addition to silicon oxide, the intermediate layer 7 can be made of appropriate insulating materials such as, for example, silicon nitride and alumina.

The support substrate 8 is made of Si, for example. A plane orientation of the surface of Si on the piezoelectric layer 2 side may be (100) or (110), or may be (111). Preferably, high-resistance Si having a resistivity of, for example, about 4 kΩ or more is desirable. However, the support substrate 8 can also be configured by using an appropriate insulating material or semiconductor material. Examples of materials for the support substrate 8 include piezoelectric materials such as aluminum oxide, lithium tantalate, lithium niobate, and quartz crystal, various ceramics such as alumina, magnesia, sapphire, silicon nitride, aluminum nitride, silicon carbide, zirconia, cordierite, mullite, steatite, and forsterite, dielectrics such as diamond and glass, and semiconductors such as gallium nitride.

The plurality of electrode fingers 3 and electrode fingers 4, the first busbar electrode 5, and the second busbar electrode 6 are preferably made of an appropriate metal or alloy such as, for example, Al or an AlCu alloy. In the first example embodiment, for example, the electrode finger 3, the electrode finger 4, the first busbar electrode 5, and the second busbar electrode 6 have a structure in which an Al film is laminated on a Ti film. Note that an adhesion layer other than the Ti film may be used.

During driving, an AC voltage is applied between the plurality of electrode fingers 3 and the plurality of electrode fingers 4. More specifically, an AC voltage is applied between the first busbar electrode 5 and the second busbar electrode 6. As a result, it is possible to obtain resonance characteristics using bulk waves of the first-order thickness shear mode excited in the piezoelectric layer 2.

Further, in the acoustic wave device 1, for example, d/p is set to about 0.5 or less, where d is the thickness of the piezoelectric layer 2 and p is the center-to-center distance between any adjacent electrode finger 3 and electrode finger 4 among the plurality of pairs of electrode fingers 3 and electrode fingers 4. As a result, the bulk waves of the first-order thickness shear mode are effectively excited, and good resonance characteristics can be obtained. More preferably, for example, d/p is about 0.24 or less, and in this case, even better resonance characteristics can be obtained.

In addition, when at least one of the electrode finger 3 and the electrode finger 4 includes a plurality of electrode fingers as in the first example embodiment, that is, when there are 1.5 or more pairs of the electrode fingers 3 and 4, each of the pairs consisting of the electrode finger 3 and the electrode finger 4, the center-to-center distance between the adjacent electrode finger 3 and electrode finger 4 is the average distance of the center-to-center distances between adjacent ones of the electrode fingers 3 and 4.

Since the acoustic wave device 1 of the first example embodiment has the above-described configuration, even when the number of pairs of the electrode fingers 3 and the electrode fingers 4 is reduced in order to reduce the size, a Q value is less likely to decrease. This is because the resonator does not require reflectors on respective sides, and a propagation loss is small. In addition, the reason why the above reflector is not required is that the bulk wave of the first-order thickness shear mode is used.

Figure 3A:
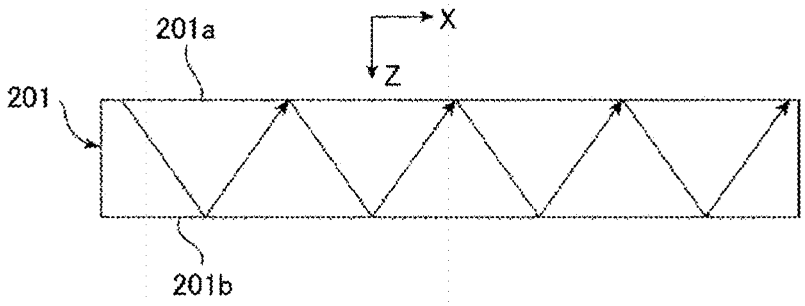
FIG. 3A is a schematic sectional view describing a Lamb wave (plate wave) which propagates through a piezoelectric layer of Comparative Example.
Figure 3B:
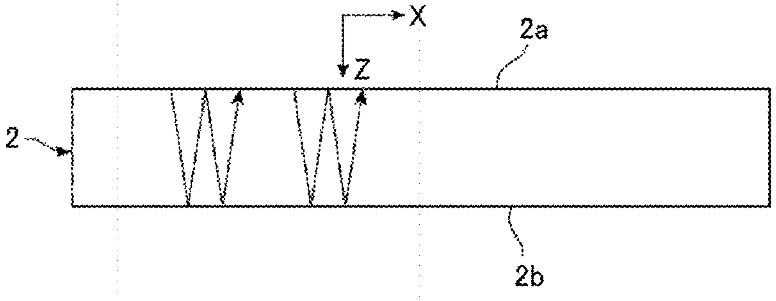
FIG. 3B is a schematic sectional view describing a bulk wave in a first-order thickness shear mode, which propagates through a piezoelectric layer of an example embodiment of the present invention.
Figure 4:
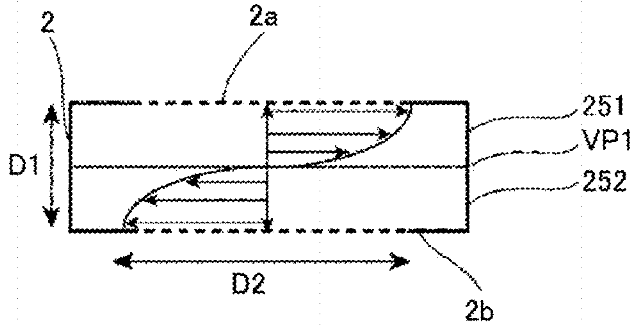
FIG. 4 is a schematic sectional view describing an amplitude direction of a bulk wave in a first-order thickness shear mode, which propagates through a piezoelectric layer of an example embodiment of the present invention.

FIG. 3A is a schematic sectional view describing a Lamb wave (plate wave) propagating through the piezoelectric layer of Comparative Example. FIG. 3B is a schematic sectional view describing a bulk wave in the first-order thickness shear mode, which propagates through the piezoelectric layer of the first example embodiment. FIG. 4 is a schematic sectional view describing an amplitude direction of the bulk wave in the first-order thickness which shear mode, propagates through the piezoelectric layer of the first example embodiment.

In FIG. 3A, an acoustic wave device as described in Japanese Unexamined Patent Application Publication No. 2007-312164 is illustrated, in which a Lamb wave propagates through the piezoelectric layer. As illustrated in FIG. 3A, waves propagate through a piezoelectric layer 201 as indicated by an arrow. Here, in the piezoelectric layer 201, there are a first main surface 201*a* and a second main surface 201*b*, and a thickness direction connecting the first main surface 201*a* and the second main surface 201*b* is the Z direction. The X direction is a direction in which electrode fingers 3 and 4 of the IDT electrode are arranged. As illustrated in FIG. 3A, in the Lamb wave, the wave propagates in the X direction as illustrated in the drawing. Since the wave is a plate wave, although the piezoelectric layer 201 as a whole vibrates, since the wave propagates in the X direction, reflectors are disposed on respective sides to obtain resonance characteristics. Therefore, when a wave propagation loss occurs and size reduction is attempted, that is, when the number of pairs of the electrode fingers 3 and 4 is decreased, the Q value decreases.

Meanwhile, as illustrated in FIG. 3B, in the acoustic wave device of the first example embodiment, since a vibration displacement is in a thickness shear direction, the wave propagates and resonates substantially in the direction connecting the first main surface 2*a* and the second main surface 2*b* of the piezoelectric layer 2, that is, in the Z direction. That is, an X-direction component of the wave is significantly smaller than a Z-direction component. Further, since resonance characteristics are obtained by waves propagating in the Z direction, no reflector is required. Therefore, no propagation loss occurs due to propagation to the reflector. Therefore, even when the number of electrode pairs including the electrode finger 3 and the electrode finger 4 is reduced in an attempt to promote size reduction, the Q value is less likely to decrease.

The amplitude directions of the bulk waves of the first-order thickness shear mode are opposite to each other in a first region 251 included in the excitation region C (refer to FIG. 1B) of the piezoelectric layer 2 and a second region 252 included in the excitation region C, as illustrated in FIG. 4. FIG. 4 schematically illustrates a bulk wave when a voltage is applied between the electrode finger 3 and the electrode finger 4 such that the potential of the electrode finger 4 is higher than that of the electrode finger 3. The first region 251 is a region of the excitation region C between the first main surface 2*a* and a virtual plane VP1 that is orthogonal or substantially orthogonal to the thickness direction of the piezoelectric layer 2 and bisects the piezoelectric layer 2. The second region 252 is a region of the excitation region C between the virtual plane VP1 and the second main surface 2*b*.

In the acoustic wave device 1, at least one pair of electrodes including the electrode finger 3 and the electrode finger 4 is disposed. However, since waves do not propagate in the X direction, the number of electrode pairs including the electrode finger 3 and the electrode finger 4 does not necessarily need to be plural. That is, at least one pair of electrodes may be provided.

For example, the electrode finger 3 is an electrode connected to a hot potential and the electrode finger 4 is an electrode connected to a ground potential. However, the electrode finger 3 may be connected to the ground potential and the electrode finger 4 may be connected to the hot potential. In the first example embodiment, at least one pair of electrodes is the electrode connected to the hot potential or the electrode connected to a ground potential, as described above, and no floating electrodes are provided.

Figure 5:
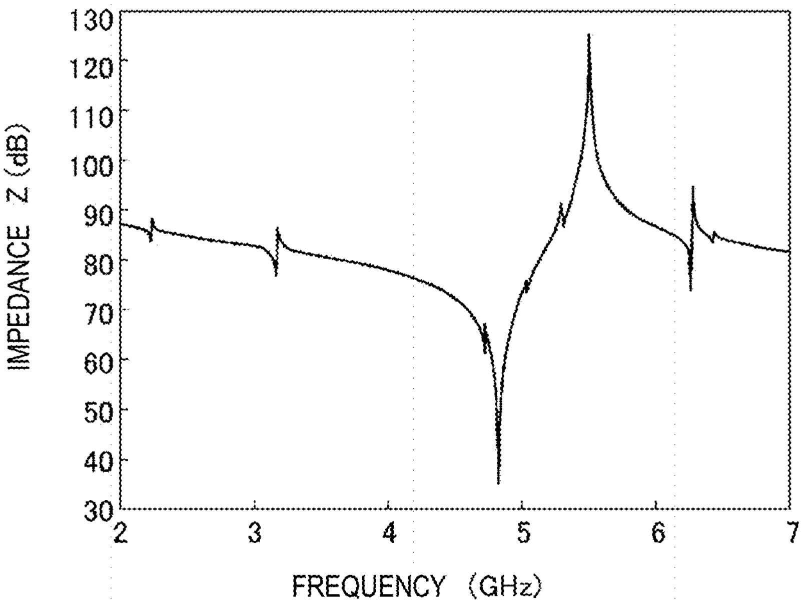
FIG. 5 is an explanatory diagram illustrating an example of resonance characteristics of an acoustic wave device of an example embodiment of the present invention.

FIG. 5 is an explanatory diagram illustrating an example of resonance characteristics of the acoustic wave device of the first example embodiment. It should be noted that the design parameters of the acoustic wave device 1 with the resonance characteristics illustrated in FIG. 5 are as follows.

Piezoelectric layer 2: $LiNbO_3$ with Euler angles (0°, 0°, 90°)

Thickness of piezoelectric layer 2: about 400 nm

Length of excitation region C (refer to FIG. 1B): about 40 μm

Number of pairs of electrodes including electrode finger 3 and electrode finger 4: 21 pairs Center-to-center distance (pitch) between electrode finger 3 and electrode finger 4: about 3 μm Width of electrode finger 3 and electrode finger 4: about 500 nm d/p: about 0.133

Intermediate layer 7: Silicon oxide film with a thickness of about 1 μm

Support substrate 8: Si

Further, the excitation region C (refer to FIG. 1B) is a region where the electrode finger 3 and the electrode finger 4 overlap each other when viewed in the X direction orthogonal or substantially orthogonal to the length direction of the electrode finger 3 and the electrode finger 4. The length of the excitation region C is the dimension along the length direction of the electrode finger 3 and the electrode finger 4 of the excitation region C. Here, the excitation region C is an example of an "intersecting region".

In the first example embodiment, center-to-center distance between electrode pairs including the electrode finger 3 and the electrode finger 4 were all equal or substantially equal in the plurality of pairs. That is, the electrode finger 3 and the electrode finger 4 were disposed at equal or substantially equal pitches.

As is clear from FIG. 5, good resonance characteristics with a fractional band of about 12.5% are obtained in spite of having no reflector.

d/p is about 0.5 or less, more preferably about 0.24 or less in the first example embodiment, where d is the thickness of the piezoelectric layer 2 and p is the center-to-center distance of electrodes between the electrode finger 3 and the electrode finger 4. This will be explained with reference to FIG. 6.

Figure 6:
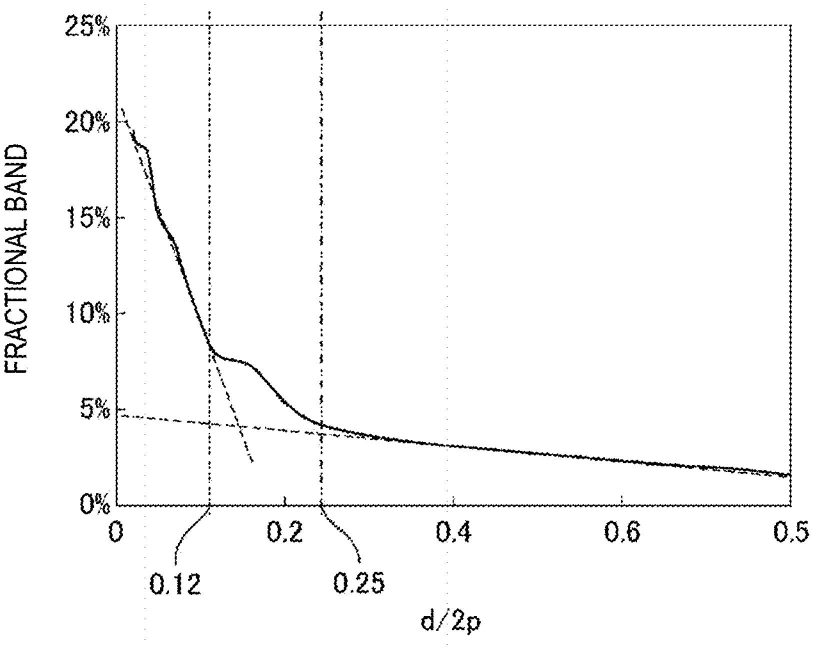
FIG. 6 is an explanatory diagram illustrating a relationship between d/2 p and a fractional band as a resonator, when p is a center-to-center distance between adjacent electrodes or an average distance of the center-to-center distances and d is an average thickness of a piezoelectric layer in an acoustic wave device of an example embodiment of the present invention.

A plurality of acoustic wave devices were obtained by changing d/2 p in the same manner as the acoustic wave device with the resonance characteristics illustrated in FIG. 5. FIG. 6 is an explanatory diagram illustrating a relationship between d/2 p and a fractional band as a resonator, when p is a center-to-center distance between adjacent electrodes or an average distance of the center-to-center distances and d is an average thickness of the piezoelectric layer 2 in the acoustic wave device of the first example embodiment.

As illustrated in FIG. 6, when d/2 p exceeds about 0.25, that is, when d/p> about 0.5, even when d/p is adjusted, the fractional band is less than about 5%. Meanwhile, when d/2 p≤ about 0.25, that is, d/p≤ about 0.5, the fractional band can be increased to about 5% or more by changing d/p within that range, that is, a resonator having a high coupling coefficient can be configured. Further, when d/2 p is about 0.12 or less, that is, when d/p is about 0.24 or less, the fractional band can be increased to about 7% or more. In addition, by adjusting d/p within this range, a resonator with a wider fractional band can be obtained, and a resonator with a higher coupling coefficient can be realized. Therefore, by setting d/p to about 0.5 or less, for example, it is possible to configure a resonator having a high coupling coefficient using the bulk wave of the first-order thickness shear mode.

In addition, at least one pair of electrodes may be one pair, and the p is the center-to-center distance between the electrode finger 3 and the electrode finger 4 adjacent to each other in the case of one pair of electrodes. In addition, in the case of 1.5 or more pairs of electrodes, the average distance of the center-to-center distances between the electrode finger 3 and the electrode finger 4 adjacent to each other may be p.

As for the thickness d of the piezoelectric layer 2, when the piezoelectric layer 2 has variations in thickness, a value obtained by averaging the thickness may be adopted.

Figure 7:
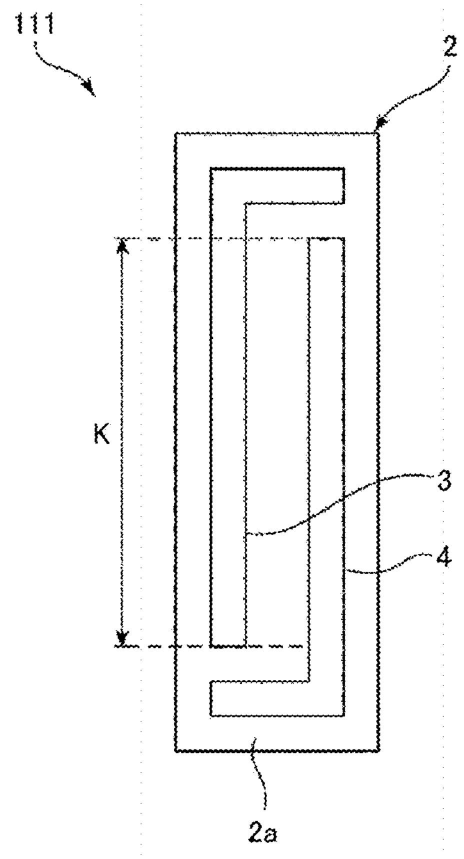
FIG. 7 is a plan view illustrating an example in which one pair of electrodes is provided in an acoustic wave device of an example embodiment of the present invention.

FIG. 7 is a plan view illustrating an example in which one pair of electrodes is provided in the acoustic wave device of the first example embodiment. In an acoustic wave device 101, one pair of electrodes including the electrode finger 3 and the electrode finger 4 is preferably provided on the first main surface 2*a* of the piezoelectric layer 2.

K in FIG. 7 is an intersecting width. As described above, in the acoustic wave device of the present disclosure, the number of pairs of electrodes may be one. Even in this case, when the above d/p is about 0.5 or less, it is possible to effectively excite the bulk wave in the first-order thickness shear mode.

In the acoustic wave device 1, preferably, it is preferable that MR≤ about 1.75 (d/p)+0.075 is satisfied, where MR is the metallization ratio of the adjacent electrode finger 3 and electrode finger 4 to the excitation region C. The excitation region C is the region where any adjacent electrode finger 3 and electrode finger 4 of the plurality of electrode fingers 3 and electrode fingers 4 overlap each other when viewed in the facing direction of the electrode finger 3 and the electrode finger 4. In that case, spurious waves can be effectively reduced. This will be described with reference to FIGS. 8 and 9.

Figure 8:
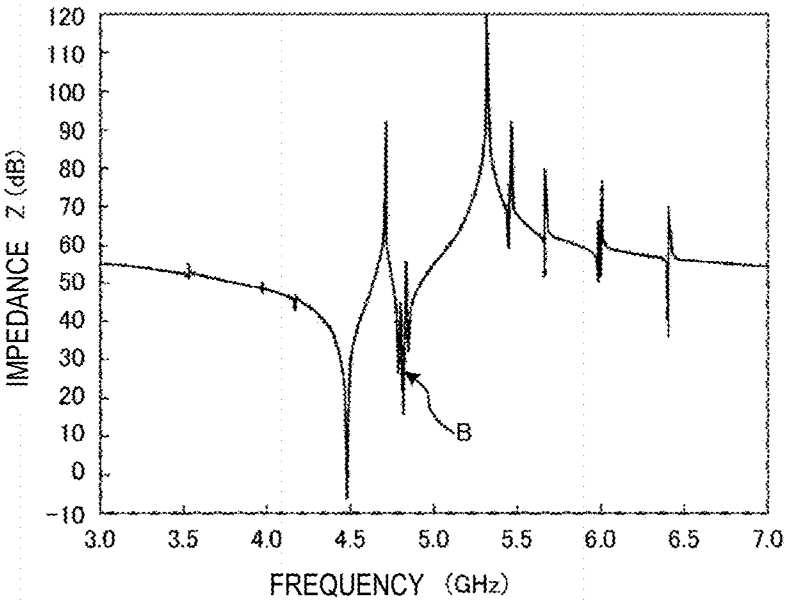
FIG. 8 is a reference diagram illustrating one example of resonance characteristics of the acoustic wave device of the first example embodiment of the present invention.

FIG. 8 is a reference diagram illustrating one example of resonance characteristics of the acoustic wave device of the first example embodiment. A spurious wave indicated by an arrow B appears between a resonant frequency and an anti-resonant frequency. In addition, as d/p=about 0.08, Euler angles of $LiNbO_3$ were set to (0°, 0°, 90°). In addition, the metallization ratio MR was set to about 0.35.

The metallization ratio MR will be described with reference to FIG. 1B. In the electrode structure of FIG. 1B, when attention is paid to one pair of the electrode finger 3 and the electrode finger 4, it is assumed that only the pair of electrode finger 3 and the electrode finger 4 is provided. In this case, a part surrounded by a dashed-dotted line is the excitation region C. The excitation region C is a region of the electrode finger 3 that overlaps the electrode finger 4, a region of the electrode finger 4 that overlaps the electrode finger 3, and a region between the electrode finger 3 and the electrode finger 4 where the electrode finger 3 and the electrode finger 4 overlap each other when the electrode finger 3 and the electrode finger 4 are viewed in the direction orthogonal to the length direction of the electrode finger 3 and the electrode finger 4, that is, in the facing direction of the electrode finger 3 and the electrode finger 4. An area of the electrode finger 3 and the electrode finger 4 in the excitation region C with respect to an area of this excitation region C is the metallization ratio MR. That is, the metallization ratio MR is the ratio of the area of the metallization portion to the area of the excitation region C.

In addition, when the plurality of pairs of the electrode fingers 3 and the electrode fingers 4 are provided, the ratio of the metallization portion included in the entire excitation region C with respect to the total area of the excitation region C may be MR.

Figure 9:
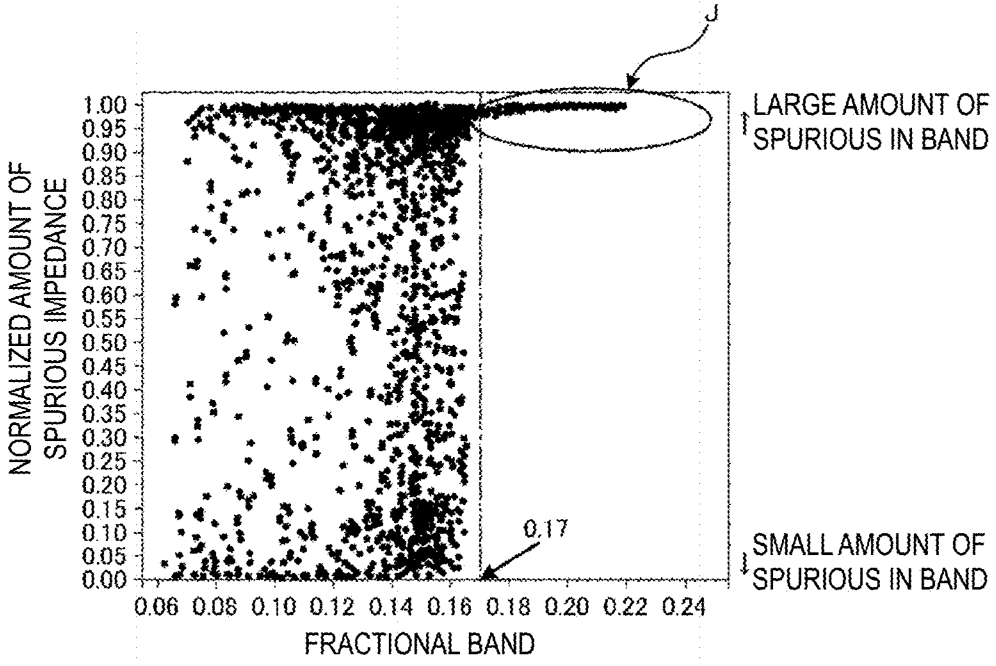
FIG. 9 is an explanatory diagram illustrating a relationship between a fractional band of an acoustic wave device of an example embodiment of the present invention defining each of multiple acoustic wave resonators, and a phase rotation amount of the spurious wave impedance normalized by 180 degrees as a magnitude of the spurious wave.

FIG. 9 is an explanatory diagram illustrating a relationship between a fractional band of the acoustic wave device of the first example embodiment constituting each of multiple acoustic wave resonators, and a phase rotation amount of the spurious wave impedance normalized by about 180 degrees as a magnitude of the spurious wave. The fractional band was adjusted by variously changing the film thickness of the piezoelectric layer 2 or the dimensions of the electrode finger 3 and the electrode finger 4. Moreover, FIG. 9 illustrates the results when the piezoelectric layer 2 containing Z-cut $LiNbO_3$ is used, but the same tendency is obtained even when the piezoelectric layer 2 having other cut-angles are used.

In a region surrounded by an ellipse J in FIG. 9, the spurious wave is as large as about 1.0. As is clear from FIG. 9, when the fractional band exceeds about 0.17, that is, exceeds about 17%, a large spurious wave with a spurious wave level of about 1 or more appears in a pass band even when the parameters constituting the fractional band are changed. That is, as in the resonance characteristics illustrated in FIG. 8, a large spurious wave indicated by an arrow B appears within the band. Therefore, the fractional band is, for example, preferably about 17% or less. In this case, by adjusting the film thickness of the piezoelectric layer 2 and the dimensions of the electrode finger 3 and the electrode finger 4, and the like, the spurious waves can be reduced.

Figure 10:
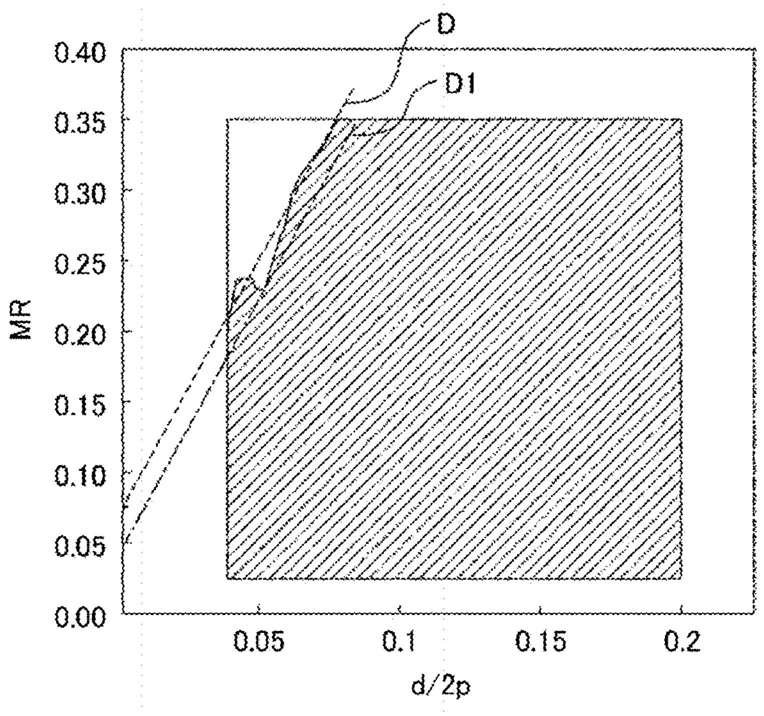
FIG. 10 is an explanatory diagram illustrating a relationship of d/2 p, a metallization ratio MR, and a fractional band.

FIG. 10 is an explanatory diagram illustrating a relationship of d/2 p, the metallization ratio MR, and the fractional band. In the acoustic wave device 1 of the first example embodiment, various acoustic wave devices 1 having different d/2 p and MR were configured, and the fractional band was measured. A hatched portion on a right side of a broken line D in FIG. 10 is the region where the fractional band is about 17% or less. A boundary between the hatched region and the non-hatched region is expressed by MR=about 3.5 (d/2 p)+0.075. That is, MR=about 1.75 (d/p)+0.075. Therefore, for example, preferably, MR≤ about 1.75 (d/p)+0.075. In that case, it is easy to set the fractional band to about 17% or less. A region on a right side of MR=about 3.5 (d/2 p)+0.05 indicated by a dashed-dotted line D1 in FIG. 10 is more preferable. That is, when MR≤ about 1.75 (d/p)+0.05, the fractional band can be reliably reduced to about 17% or less.

Figure 11:
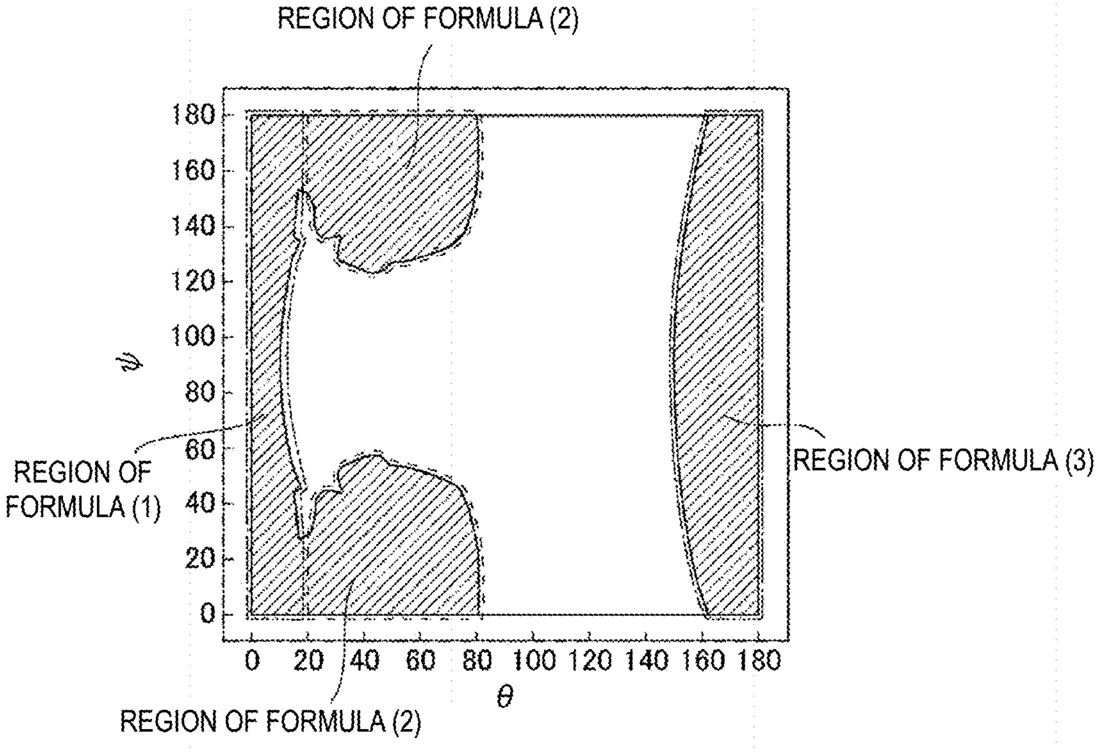
FIG. 11 is an explanatory diagram illustrating a map of the fractional bands with respect to Euler angles (0°, θ, Ψ) of $LiNbO_3$ when d/p is brought as close to 0 as possible.

FIG. 11 is an explanatory diagram illustrating a map of a fractional band with respect to the Euler angles (0°, θ, Ψ) of $LiNbO_3$ in a case where the thickness d with respect to the pitch p is made extremely small, that is, the d/p is made to be extremely close to 0, in order to excite a bulk wave of the first-order thickness shear mode. The hatched portion in FIG. 11 is a region where a fractional band of at least 5% or more is obtained. When the range of the region is approximated, the range is a range represented by Formula (1), Formula (2), and Formula (3) below.

$$(0^\circ \pm 10^\circ, 0^\circ \text{ to } 20^\circ, \text{any } \psi) \quad \text{Formula (1)}$$

$$(0^\circ \pm 10^\circ, 20^\circ \text{ to } 80^\circ, 0^\circ \text{ to } 60^\circ(1-(\theta-50)^2/900)^{1/2}) \text{ or } (0^\circ \pm 10^\circ, 20^\circ \text{ to } 80^\circ, [180^\circ - 60^\circ(1-(\theta-50)^2/900)^{1/2}] \text{ to } 180^\circ) \quad \text{Formula (2)}$$

$$(0^\circ \pm 10^\circ, [180^\circ - 30^\circ(1-(\psi-90)^2/8100)^{1/2}] \text{ to } 180^\circ, \text{any } \psi) \quad \text{Formula (3)}$$

Therefore, in the case of the Euler angle range of Formula (1), Formula (2), or Formula (3) described above, the fractional band can be sufficiently widened, which is preferable.

Figure 12:
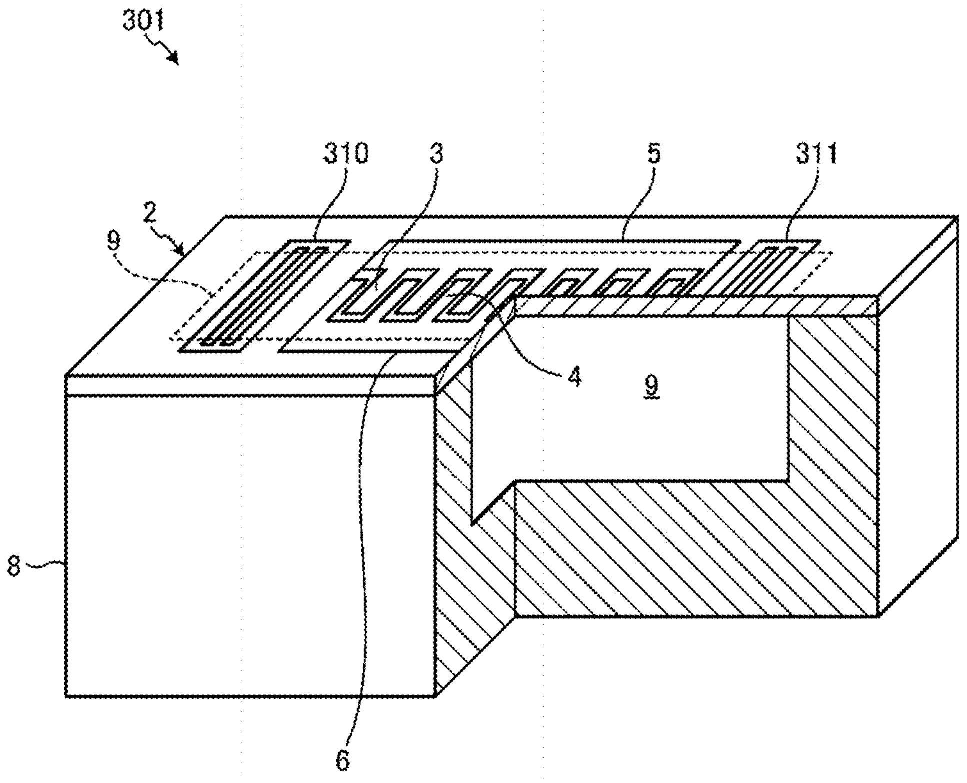
FIG. 12 is a partially cutaway perspective view describing an acoustic wave device according to an example embodiment of the present invention.

FIG. 12 is a partially cutaway perspective view describing an acoustic wave device according to an example embodiment of the present invention. In FIG. 12, an outer periphery of the space portion 9 is indicated by broken lines. The acoustic wave device of the present disclosure may use a plate wave. In this case, as illustrated in FIG. 12, an acoustic wave device 301 includes reflectors 310 and 311. The reflectors 310 and 311 are provided on respective sides of the electrode fingers 3 and 4 of the piezoelectric layer 2 in the acoustic wave transmission direction. In the acoustic wave device 301, an AC electric field is applied to the electrode fingers 3 and 4 on the space portion 9 to excite a Lamb wave. In this case, since the reflectors 310 and 311 are provided on respective sides, resonance characteristics by the Lamb wave can be obtained.

As described above, in the acoustic wave devices 1 and 101, a bulk wave in the first-order thickness shear mode is used. Further, in the acoustic wave devices 1 and 101, the first electrode finger 3 and the second electrode finger 4 are electrodes adjacent to each other, and d/p is set to about 0.5 or less, when d is the thickness of the piezoelectric layer 2 and p is the center-to-center distance between the first electrode finger 3 and the second electrode finger 4. Accordingly, the Q value can be increased even when the acoustic wave device is reduced in size.

In the acoustic wave devices 1 and 101, the piezoelectric layer 2 is made of, for example, lithium niobate or lithium tantalate. It is preferable that the first main surface 2*a* or the second main surface 2*b* of the piezoelectric layer 2 is provided with the first electrode finger 3 and the second electrode finger 4 opposing each other in the direction that intersects the thickness direction of the piezoelectric layer 2, and the first electrode finger 3 and the second electrode finger 4 are covered with a protective film.

Figure 13:
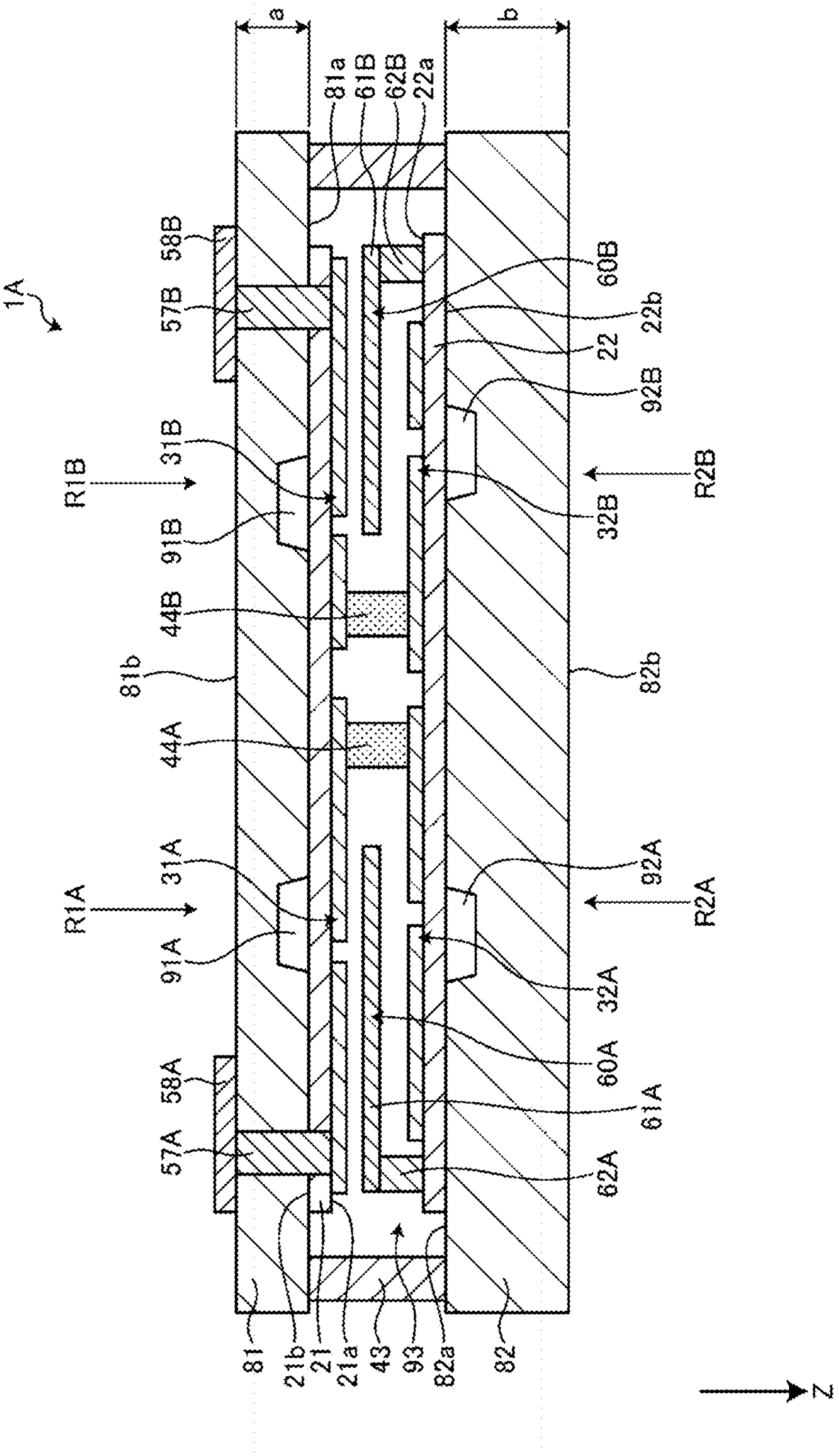
FIG. 13 is a schematic sectional view illustrating an example of an acoustic wave device according to an example embodiment of the present invention.

FIG. 13 is a schematic sectional view illustrating an example of the acoustic wave device according to the first example embodiment. As illustrated in FIG. 13, an acoustic wave device 1A according to the first example embodiment includes a first piezoelectric layer 21, a first support portion, first resonators R1A and R1B, a second piezoelectric layer 22, a second support portion, second resonators R2A and R2B, joining portions 44A and 44B, a sealing portion 43, through electrodes 57A and 57B, outer electrodes 58A and 58B, and shield electrodes 60A and 60B.

The first piezoelectric layer 21 is a layer including a piezoelectric material such as, for example, $LiNbO_3$ and having a thickness in the Z direction. The first piezoelectric layer 21 includes a first main surface 21*a* and a second main surface 21*b* which is the main surface opposite to the first main surface 21*a* in the Z direction.

The first support portion includes a first support substrate 81. The first support substrate 81 is a substrate having a thickness in the Z direction. The first support substrate 81 is preferably a substrate made of, for example, silicon. The first support substrate 81 is provided on the second main surface 21*b* side of the first piezoelectric layer 21 and at a position overlapping the first piezoelectric layer 21 in plan view in the Z direction. In the following description, the main surface of the first support substrate 81 on the first piezoelectric layer 21 side may be referred to as a first main surface 81*a*, and the main surface of the first support substrate 81 opposite to the first main surface 81*a* in the Z direction may be referred to as a second main surface 81*b*.

The first resonators R1A and R1B are resonators including the functional electrodes 31A and 31B, respectively. The first resonators R1A and R1B are provided on the first main surface 21*a* of the first piezoelectric layer 21. The functional electrodes 31A and 31B are IDT electrodes including the first electrode fingers 3, the second electrode fingers 4, the first busbar electrode 5, and the second busbar electrode 6 illustrated in FIG. 1B.

The first support portion includes a space portion on the first piezoelectric layer 21 side. In the first example embodiment, the first support substrate 81 preferably includes space portions 91A and 91B on the first piezoelectric layer 21 side. The space portions 91A and 91B are located at positions overlapping at least portions of the functional electrodes 31A and 31B, respectively, in a plan view in the Z direction. As a result, the first resonators R1A and R1B can be satisfactorily operated.

The second piezoelectric layer 22 is a layer consisting of a piezoelectric material such as, for example, $LiNbO_3$ and having a thickness in the Z direction.

The second piezoelectric layer 22 includes a third main surface 22*a* and a fourth main surface 22*b* which is the main surface opposite to the third main surface 22*a* in the Z direction. The third main surface 22*a* of the second piezoelectric layer 22 faces the first main surface 21*a* of the first piezoelectric layer 21 in the Z direction.

The second support portion includes a second support substrate 82. The second support substrate 82 is a substrate having a thickness in the Z direction. The second support substrate 82 is preferably a substrate made of, for example, silicon. The second support substrate 82 is provided on the fourth main surface 22*b* side of the second piezoelectric layer 22 at a position overlapping the second piezoelectric layer 22 in a plan view in the Z direction. In the following description, the main surface of the second support substrate 82 on the second piezoelectric layer 22 side may be referred to as a first main surface 82*a*, and the main surface of the second support substrate 82 opposite to the first main surface 82*a* in the Z direction may be referred to as a second main surface 82*b*. Here, the first main surface 81*a* of the first support substrate 81 on the first piezoelectric layer 21 side and the first main surface 82*a* of the second support substrate 82 on the second piezoelectric layer 22 side oppose each other in the Z direction.

The second resonators R2A and R2B are resonators including the functional electrodes 32A and 32B, respectively. The second resonators R2A and R2B are provided on the third main surface 22*a* of the second piezoelectric layer 22. The functional electrodes 32A and 32B are IDT electrodes including the first electrode fingers 3, the second electrode fingers 4, the first busbar electrode 5, and the second busbar electrode 6 illustrated in FIG. 1B.

The second support portion includes a space portion on the second piezoelectric layer 22 side. In the first example embodiment, the second support substrate 82 includes space portions 92A and 92B on the second piezoelectric layer 22 side. The space portions 92A and 92B are located at positions overlapping at least portions of the functional electrodes 32A and 32B, respectively, in plan view in the Z direction. As a result, the second resonators R2A and R2B can be satisfactorily operated.

The sealing portion 43 is preferably defined by a structure that seals a space 93 between the first support substrate 81 and the second support substrate 82. In the first example embodiment, the sealing portion 43 is formed in a linear pattern to surround the first piezoelectric layer 21 and the second piezoelectric layer 22 in plan view in the Z direction, and one side in the Z direction is bonded to the first support substrate 81 and the other side in the Z direction is bonded to the second support substrate 82. With this shape, the sealing portion 43 can seal the space 93 and can protect the functional electrodes 31A, 31B, 32A, and 32B in the space 93.

The joining portions 44A and 44B are preferably structures that electrically connect the first resonators RIA and R1B to the second resonators R2A and R2B. Here, the joining portions 44A and 44B are examples of a "joining portion". The joining portions 44A and 44B are made of a conductive material. The joining member 44A is provided to join the functional electrode 31A and the functional electrode 32A to each other in the Z direction. As a result, the first resonator R1A and the second resonator R2A can be electrically connected. The joining member 44B is provided to join the functional electrode 31B and the functional electrode 32B in the Z direction. As a result, the first resonator R1B and the second resonator R2B can be electrically connected.

The through electrodes 57A and 57B are electrodes that pass through the support substrate. In the first example embodiment, the through electrodes 57A and 57B are provided to pass through the first support substrate and the first piezoelectric layer 21. One end portions of the through electrodes 57A and 57B in the Z direction are provided to be electrically connected to the functional electrodes 31A and 31B of the first resonators R1A and R1B, respectively. The other end portions of the through electrodes 57A and 57B in the Z direction are provided to be connected to the outer electrodes 58A and 58B, which will be described later, respectively. As a result, the heat dissipation properties of the first resonators R1A and R1B can be improved. Alternatively, the through electrodes may be provided in the second support substrate 82 and may be electrically connected to the functional electrodes 32A and 32B of the second resonators R2A and R2B, respectively. In this case, the heat dissipation properties of the second resonators R2A and R2B can be improved.

The outer electrodes 58A and 58B are electrodes corresponding to an extended electrodes of the acoustic wave device 1A. The outer electrodes 58A and 58B are provided at positions overlapping the through electrodes 57A and 57B, respectively, in plan view in the Z direction. In the example of FIG. 13, the outer electrodes 58A and 58B are provided on the first support substrate 81 on a side opposite to the first piezoelectric layer 21 side in the Z direction.

The shield electrodes 60A and 60B are provided to cover the functional electrodes 31A and 31B of the first resonators R1A and R1B or the functional electrodes 32A and 32B of the second resonators R2A or R2B. In the first example embodiment, the shield electrodes 60A and 60B include shield portions 61A and 61B and support portions 62A and 62B. The shield portion 61A is a plate-shaped structure provided between the functional electrode 31A and the functional electrode 32A in the Z direction. The support portion 62A is a structure that is provided on the third main surface 22*a* of the second piezoelectric layer 22 and supports the shield portion 61A. The shield portion 61B is a plate-shaped structure provided between the functional electrode 31B and the functional electrode 32B in the Z direction, in a plan view in the Z direction. The support portion 62B is a structure that is provided on the third main surface 22*a* of the second piezoelectric layer 22 and supports the shield portion 61B. Accordingly, since the space between the first resonators R1A and R1B and the second resonator R2A and R2B in the Z direction is shielded, it is possible to reduce or prevent the deterioration of the frequency characteristics of, among the first resonators R1A and R1B and the second resonators R2A and R2B, the other of the resonators by the leakage waves generated by the operation of one of the resonators propagating to the other of the resonators through the space 93.

In the acoustic wave device according to the first example embodiment, as illustrated in FIG. 13, a thickness a of the first support substrate 81 and a thickness b of the second support substrate 82 are different from each other. The thickness a and the thickness b are measured in the sectional view in the Z direction. Accordingly, it is possible to reduce or prevent the deterioration of the frequency characteristics of the acoustic wave device due to ripples. Hereinafter, the details will be described.

Figure 14:
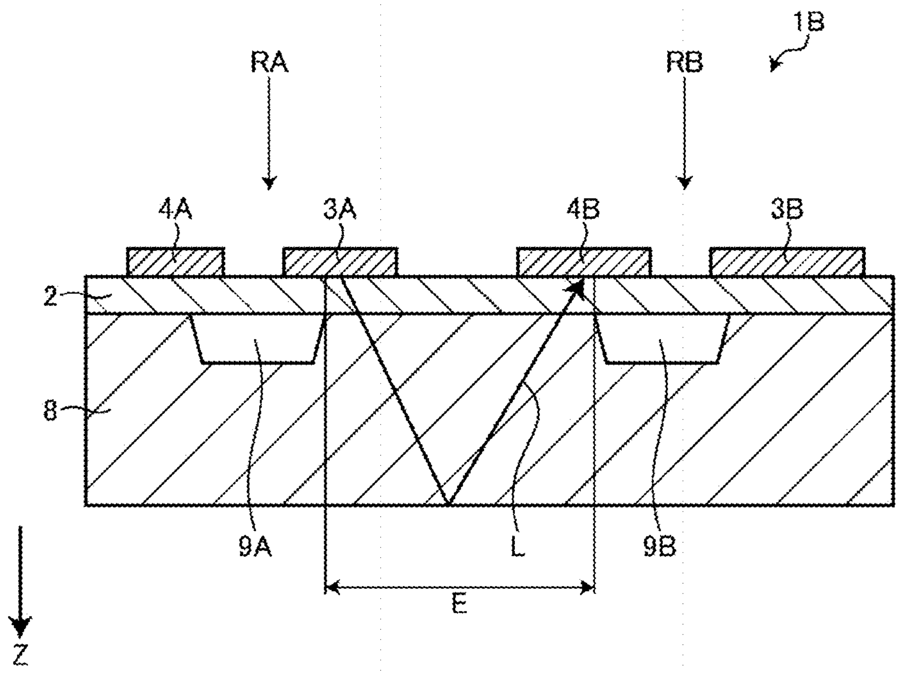
FIG. 14 is a schematic sectional view describing a leakage wave in an acoustic wave device using a bulk acoustic wave in a first-order thickness shear mode.

FIG. 14 is a schematic sectional view describing a leakage wave in the acoustic wave device using a bulk acoustic wave in the first-order thickness shear mode. An acoustic wave device 1B illustrated in FIG. 14 has a plurality of resonators RA and RB on the same support substrate 8. The one resonator RA includes a first electrode finger 3A and a second electrode finger 4A as the functional electrode, and the other resonator RB includes a first electrode finger 3B and a second electrode finger 4B as the functional electrode. Here, the first electrode fingers 3A and 3B are electrodes connected to a hot potential, and the second electrode fingers 4A and 4B are electrodes connected to a ground potential. The support substrate 8 is provided with space portions 9A and 9B for the respective resonators RA and RB on the piezoelectric layer 2 side.

In the acoustic wave device 1B illustrated in FIG. 14, since there is a potential difference between the first electrode finger 3A and the second electrode finger 4B, leakage waves L generated from the first electrode finger 3A of the resonator RA are reflected in a region E where the space portions 9A and 9B are not provided in a plan view in the Z direction of the support substrate 8 during the operation of the one resonator RA, and are transmitted to the second electrode finger 4B of the other resonator RB. As a result, ripples are generated in the other resonator RB. Here, the ripple refers to an unnecessary wave that appears as a periodic wave-shaped graph in a graph of the impedance with respect to the frequency. In a case where the ripple generated in the resonator RB is generated in the pass band of the resonator RB, there possibility is a that the frequency characteristics of the resonator RB are significantly deteriorated.

The frequency at which the ripples are generated changes when the thickness of the support substrate changes. Therefore, it is possible to reduce or prevent the ripple generated in the pass band of the resonator by adjusting the thickness of the support substrate. When the ripples generated in the pass band of the resonator are reduced or prevented, it is possible to reduce or prevent the deterioration of the frequency characteristics of the resonator.

Here, an appropriate thickness of the support substrate varies depending on the design of the resonator, the required frequency characteristics, and the like. Therefore, when a plurality of types of resonators are provided, it is required to change the thickness of the support substrate depending on the type of the resonator. However, when the thickness of the support substrate is differentiated for each element, there is a possibility that the work of picking up the acoustic wave device with the tape feeder and the mounting of the acoustic wave device on the module substrate are not appropriately performed. As a result, complicated pickup work is required, and there is a possibility that it is difficult to mount the acoustic wave device on the module substrate.

On the other hand, the acoustic wave device 1A according to the first example embodiment includes the first support substrate 81 and the second support substrate 82 which are support substrates having different thicknesses. Therefore, in the design of the acoustic wave device, the plurality of types of resonators can be provided on the support substrate of the first support substrate 81 and the second support substrate 82 having a more suitable thickness. Accordingly, it is possible to reduce or prevent the deterioration of the frequency characteristics of the acoustic wave device due to the ripple. In addition, in this case, even when the thickness of the support substrate is differentiated for each element, the thickness of the acoustic wave device can be made uniform regardless of the element. Therefore, it is not necessary to prepare the carrier tape for each thickness of the support substrate. Accordingly, the pickup work can be simplified and the mounting on the module substrate can be facilitated while the deterioration of the frequency characteristics of the acoustic wave device due to the ripple is reduced or prevented.

Figure 15:
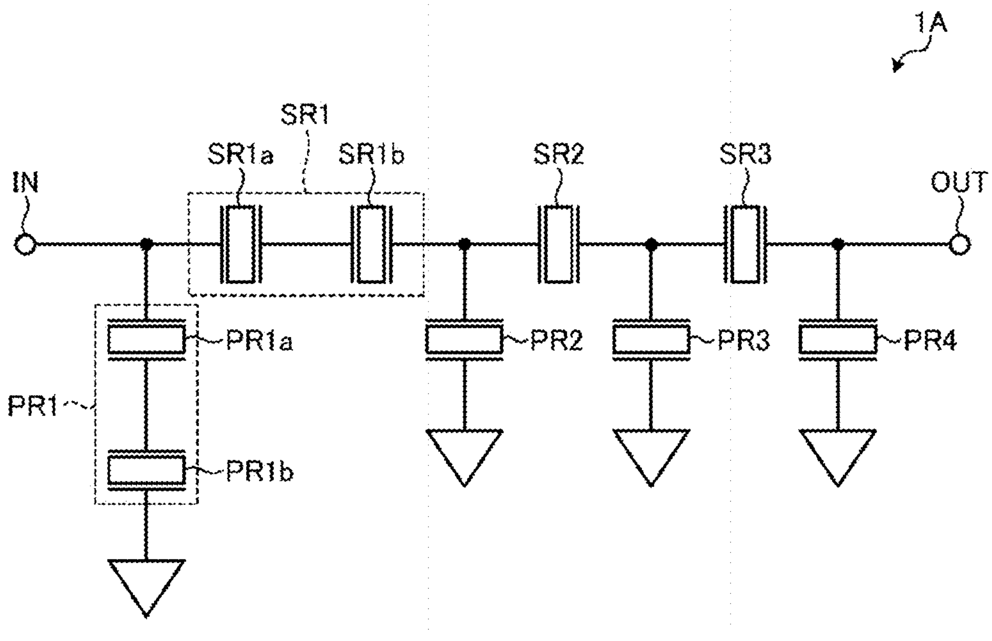
FIG. 15 is a circuit diagram of the acoustic wave device according to FIG. 13.

FIG. 15 is a circuit diagram of the acoustic wave device according to FIG. 13. As illustrated in FIG. 15, the acoustic wave device 1A is a ladder filter including a serial arm resonator inserted in series in a signal path from an input terminal IN to an output terminal OUT and a parallel arm resonator inserted in a path between the signal path and the ground. In FIG. 15, the serial arm resonators are resonators SR1 to SR3. In the resonators SR1 to SR3 that are the serial arm resonators, one terminal is electrically connected to the input terminal IN, and the other terminal is electrically connected to the output terminal OUT. Here, the resonators SR1 to SR3 are electrically connected in series to each other. On the other hand, in FIG. 15, the parallel arm resonators are resonators PR1 to PR4. One terminal of the resonator PR1 is electrically connected to the input terminal IN via a wiring line, and the other terminal is electrically connected to the ground. One terminal of the resonator PR2 is electrically connected to a wiring line connecting the resonator SR1 and the resonator SR2, and the other terminal is electrically connected to the ground. One terminal of the resonator PR3 is electrically connected to a wiring line connecting the resonator SR2 and the resonator SR3, and the other terminal is electrically connected to the ground. One terminal of the resonator PR4 is electrically connected to the output terminal OUT via a wiring line, and the other terminal is electrically connected to the ground.

In the example of FIG. 15, the serial arm resonator SR1 includes two division resonators SR1*a* and SR1*b* that are serially divided, and the parallel arm resonator PR1 includes two division resonators PR1*a* and PR1*b* that are serially divided. Here, the division resonator divided in series refers to a resonator connected in series to each other without the parallel arm resonator therebetween.

In the first example embodiment, the first resonator R1A and the second resonator R2A are the division resonators SR1*a* and SR1*b* connected in series to each other, and the first resonator R1B and the second resonator R2B are the division resonators PR1*a* and PR1*b* connected in series to each other. In other words, in the division resonator connected in series, one of the division resonators is the first resonator and the other is the second resonator. In the example of FIG. 13, the division resonator SR1*a* of the serial arm resonator SR1 is the first resonator R1A, and the division resonator SR1*b* is the second resonator R2A of the serial arm resonator SR1. In addition, the division resonator PR1*a* of the parallel arm resonator PR1 is the second resonator R2B, and the parallel arm resonator PR1 of the division resonator PR1*b* is the first resonator R1B. Here, the outer electrode 58A is the input terminal IN, and the outer electrode 58B is connected to the ground. Accordingly, the thickness of the first support substrate 81 can be set to a thickness suitable for one of the division resonators, and the thickness of the second support substrate 82 can be set to a thickness suitable for the other of the division resonators. Therefore, it is possible to reduce or prevent the deterioration of the frequency characteristics of the acoustic wave device due to the ripple.

The acoustic wave device 1A according to the first example embodiment has been described above, but the acoustic wave device according to the first example embodiment is not limited to the acoustic wave device 1A according to FIGS. 13 and 15.

For example, the number of the first resonators and the number of the second resonators illustrated in FIG. 13 are mere examples and are not limited thereto. The number of the first resonators and the number of the second resonators may each be at least one or three or more. In addition, the number of the first resonators and the number of the second resonators need not be the same.

In addition, the first support portion may include a first intermediate layer. The first intermediate layer is preferably a layer provided on the first piezoelectric layer 21 side of the first support substrate 81. That is, the first intermediate layer may be provided between the first support substrate 81 and the first piezoelectric layer 21, or the space portions 91A and 91B may be provided in the first intermediate layer. The first intermediate layer is preferably made of the same material as the intermediate layer 7. Similarly, the second support portion may include a second intermediate layer. The second intermediate layer is a layer provided on the second piezoelectric layer 22 side of the second support substrate 82. That is, the second intermediate layer may be provided between the second support substrate 82 and the second piezoelectric layer 22, and the space portions 92A and 92B may be provided in the second intermediate layer. The second intermediate layer is made of the same material as the intermediate layer 7.

In addition, the thicknesses of the first intermediate layer and the second intermediate layer may be different from each other.

In addition, the through electrodes 57A and 57B may be provided in the second support substrate 82 and the outer electrodes 58A and 58B may be provided on the second support substrate 82. In this case, the heat dissipation properties of the second resonators R2A and R2B can be improved.

In addition, the second main surface 81*b* of the first support substrate 81 and the second main surface 82*b* of the second support substrate 82 may have different surface roughnesses. Here, the surface roughness refers to an arithmetic average roughness (Ra). In particular, the surface roughness of the second main surface of the support substrate having a greater thickness of the support substrate, in which the support substrate is less likely to break, may be greater than the surface roughness of the second main surface of the support substrate having a smaller thickness. In this case, spurious waves generated in and out of the band due to support substrate reflection can be further reduced.

In addition, regarding the depths of the space portions 91A and 91B of the first support portion and the space portions 92A and 92B of the second support portion, the depth of the space portion having a greater thickness of the support substrate may be smaller. Here, the depth of the space portion refers to the maximum length in the Z direction from the surface of the support portion in contact with the piezoelectric layer to the inner wall of the support portion exposed in the space portion. In this case, the greater the thickness of the support substrate is, the smaller the deformation of the support substrate in the manufacturing process of the acoustic wave device and the like, and the smaller the deformation of the piezoelectric layer. Therefore, even in a case where the space portion is made smaller, it is possible to reduce the possibility that the piezoelectric layer comes into contact with the wall surface of the support portion at the bottom portion of the space portion. Here, in a case where the space portion is formed in the intermediate layer, the thick intermediate layer of the support substrate may be made thin.

That is, the first support substrate 81 may have a thickness greater than the second support substrate 82, and the space portions 91A and 91B in the first support portion may have a depth smaller than the space portions 92A and 92B in the second support portion. In this case, in the first support substrate 81, the deformation of the support substrate is small in the manufacturing process of the acoustic wave device or the like, and thus the deformation of the first piezoelectric layer 21 is also small. Therefore, even when the sizes of the space portions 91A and 91B in the first support portion are reduced, the possibility that the first piezoelectric layer 21 comes into contact with the inner wall of the first support portion at the bottom portion of the space portions 91A and 91B can be reduced.

In addition, the second support substrate 82 has a thickness greater than the first support substrate 81, and the space portions 92A and 92B in the second support portion may have a depth smaller than the space portions 91A and 91B in the first support portion. In this case, in the second support substrate 82, the deformation of the support substrate is small in the manufacturing process of the acoustic wave device or the like, and thus the deformation of the second piezoelectric layer 22 is also small. Therefore, even when the sizes of the space portions 92A and 92B in the second support portion are reduced, the possibility that the second piezoelectric layer 22 comes into contact with the inner wall of the second support portion at the bottom portion of the space portions 92A and 92B can be reduced.

In addition, regarding the thickness of the second piezoelectric layer 22 with respect to the first piezoelectric layer 21, the piezoelectric layer provided on the support substrate having a greater thickness may be thinner than the piezoelectric layer provided on the support substrate having a smaller thickness. In this case, the greater the thickness of the support substrate, the smaller the deformation of the support substrate in the manufacturing process of the acoustic wave device and the like, and accordingly, the smaller the deformation of the piezoelectric layer. Therefore, even when the thickness of the piezoelectric layer is small, the deformation of the piezoelectric layer in the manufacturing process of the acoustic wave device can be reduced.

In addition, the acoustic wave device according to the first example embodiment may be an acoustic wave device according to a modified example to be described below. Hereinafter, a modified example according to the first example embodiment will be described with reference to the drawings.

Figure 16:
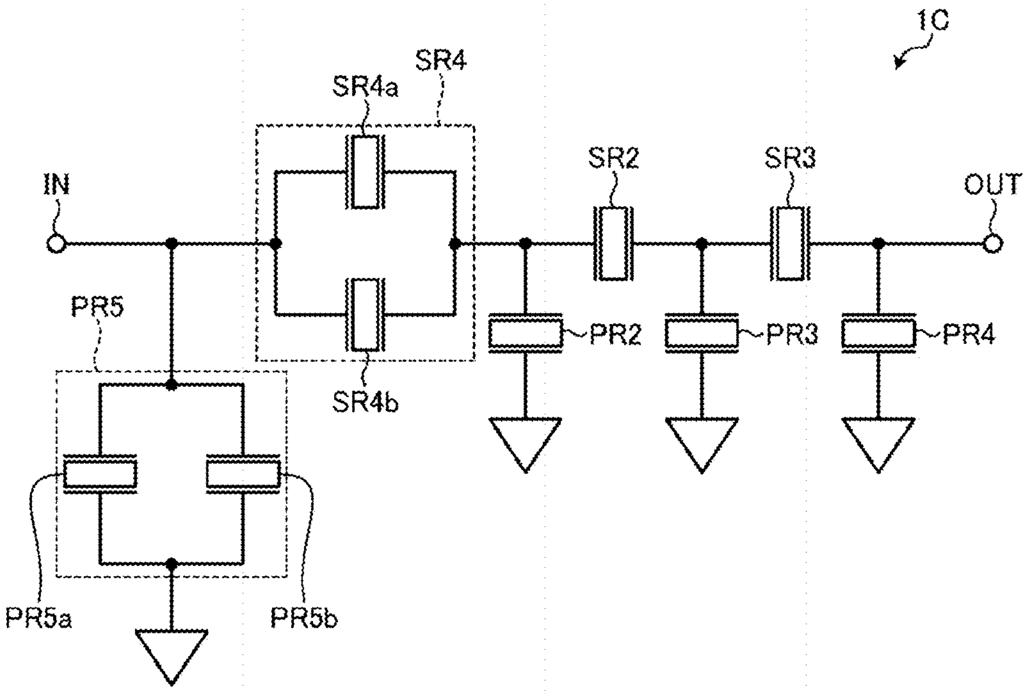
FIG. 16 is a circuit diagram of a first modified example of an acoustic wave device according to an example embodiment of the present invention.

FIG. 16 is a circuit diagram of a first modified example of the acoustic wave device according to the first example embodiment. As illustrated in FIG. 16, in an acoustic wave device 1C according to the first modified example, a resonator SR4 is provided instead of the serial arm resonator SR1 illustrated in FIG. 15, and the resonator SR5 is provided instead of the parallel arm resonator PR1. In the example of FIG. 15, the serial arm resonator SR4 includes two division resonators SR4*a* and SR4*b* that are divided in parallel, and a parallel arm resonator PR5 includes two division resonators PR5*a* and PR5*b* that are divided in parallel. Here, the division resonator that is divided in parallel refers to a resonator in which the division resonators are connected in parallel to each other without the serial arm resonator therebetween.

In the first modified example, the first resonator and the second resonator are division resonators connected in parallel to each other. In other words, of the division resonators SR4*a* and SR4*b* connected in parallel, one division resonator SR4*a* is the first resonator, and the other division resonator SR4*b* is the second resonator. In addition, in the division resonators PR5*a* and PR5*b* connected in parallel, one division resonator PR5*a* is the first resonator, and the other division resonator PR5*b* is the second resonator. Even in this case, the thickness of the first support substrate 81 can be set to a thickness suitable for one of the division resonators, and the thickness of the second support substrate 82 can be set to a thickness suitable for the other of the division resonators. Therefore, it is possible to reduce or prevent the deterioration of the frequency characteristics of the acoustic wave device due to the ripple.

Figure 17:
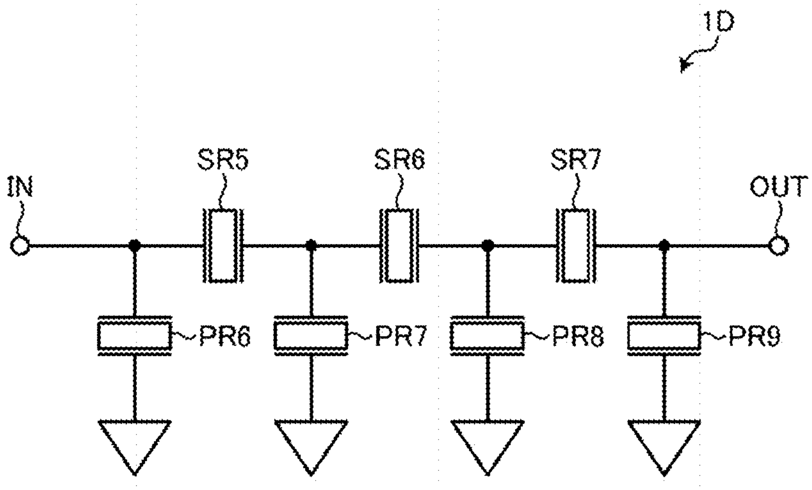
FIG. 17 is a circuit diagram of a second modified example of an acoustic wave device according to an example embodiment of the present invention.

FIG. 17 is a circuit diagram of a second modified example of the acoustic wave device according to the first example embodiment. An acoustic wave device 1D according to the second modified example is preferably a ladder filter including a serial arm resonator inserted in series in a signal path from the input terminal IN to the output terminal OUT and a parallel arm resonator inserted in a path between the signal path and the ground. In FIG. 17, the serial arm resonators are resonators SR5 to SR7. In the resonators SR5 to SR7 that are the serial arm resonators, one terminal is electrically connected to the input terminal IN, and the other terminal is electrically connected to the output terminal OUT. Here, the resonators SR5 to SR7 are electrically connected in series to each other. On the other hand, in FIG. 17, the parallel arm resonators are resonators PR6 to PR9. One terminal of the resonator PR6 is electrically connected to the input terminal IN via a wiring line, and the other terminal is electrically connected to the ground. One terminal of the resonator PR7 is electrically connected to a wiring line connecting the resonator SR5 and the resonator SR6, and the other terminal is electrically connected to the ground. One terminal of the resonator PR8 is electrically connected to a wiring line connecting the resonator SR6 and the resonator SR7, and the other terminal is electrically connected to the ground. One terminal of the resonator PR9 is electrically connected to the output terminal OUT via a wiring line, and the other terminal is electrically connected to the ground.

In the second modified example, the first resonator includes the serial arm resonators SR5 to SR7, and the second resonator includes the parallel arm resonators PR6 to PR9. Accordingly, the thickness of the first support substrate 81 can be set to a thickness suitable for the serial arm resonators SR5 to SR7, and the thickness of the second support substrate 82 can be set to a thickness suitable for the parallel arm resonators PR6 to PR9. Therefore, it is possible to reduce or prevent the deterioration of the frequency characteristics of the acoustic wave device due to the ripple. It should be noted that, also in the second modified example, the serial arm resonators SR5 to SR7 and the parallel arm resonators PR6 to PR9 may include the division resonators connected in series or in parallel.

In the second modified example, it is preferable that the through electrodes are provided in the first support substrate 81. Accordingly, it is possible to improve the heat dissipation properties of the serial arm resonators SR5 to SR7 that generate more heat than the parallel arm resonators PR6 to PR9.

As described above, the acoustic wave device according to the first example embodiment includes the first piezoelectric layer 21 including the first main surface 21*a* and the second main surface 21*b* opposite to the first main surface 2*a* in the first direction, the first support portion including the first support substrate 81 that overlaps the first piezoelectric layer 21 in the first direction, the first resonator R1A, R1B provided on at least the first main surface 2*a* of the first piezoelectric layer 21, the second piezoelectric layer 22 including the third main surface 22*a* and the fourth main surface 22*b* opposite to the third main surface 22*a* in the first direction; the second support portion including the second support substrate 82 that overlaps the second piezoelectric layer 22 in the first direction, and the second resonator R2A, R2B provided on at least the third main surface 22*a* of the second piezoelectric layer 22. The first resonator R1A, R1B and the second resonator R2A, R2B each include the functional electrode 31A, 31B, 32A, 32B. The first support portion includes the space portion 91A, 91B that overlaps at least a portion of the functional electrode of the second resonator R2A, R2B in a plan view in the first direction. The second support portion has the space portion 92A, 92B that overlaps at least a portion of the functional electrode of the second resonator R2A, R2B in the plan view in the first direction. The main surface (first main surface 81*a*) of the first support substrate 81 on the first piezoelectric layer 21 side and the main surface (first main surface 82*a*) of the second support substrate 82 on the second piezoelectric layer 22 side oppose each other in the first direction. The first resonator R1A, R1B and the second resonator R2A, R2B are electrically connected by a conductive joining portion (joining member 44A, 44B) extending in the first direction. The space 93 between the first support substrate 81 and the second support substrate 82 is sealed by a sealing portion 43. The first support substrate 81 and the second support substrate 82 have different thicknesses. Accordingly, the thickness a of the first support substrate 81 can be set to a thickness suitable for the first resonators R1A and R1B, and the thickness b of the second support substrate 82 can be set to a thickness suitable for the second resonators R2A and R2B. Therefore, it is possible to reduce or prevent the deterioration of the frequency characteristics of the acoustic wave device due to the ripple. In addition, in this case, even when the thickness of the support substrate is differentiated for each element, the thickness of the acoustic wave device can be made uniform regardless of the element. Therefore, it is not necessary to prepare the carrier tape for each thickness of the support substrate. As a result, the pickup work can be simplified, and the mounting on the module substrate can be facilitated.

As a preferable example embodiment, the first resonator R1A, R1B and the second resonator R2A, R2B are the division resonators SR1*a*, SR1*b*, PR1*a*, and PR1*b* connected in series to each other. Accordingly, the thickness of the first support substrate 81 can be set to a thickness suitable for one of the division resonators, and the thickness of the second support substrate 82 can be set to a thickness suitable for the other of the division resonators. Therefore, it is possible to reduce or prevent the deterioration of the frequency characteristics of the acoustic wave device due to the ripple.

As a preferable example embodiment, the first resonator and the second resonator are the division resonators SR4*a*, SR4*b*, PR5*a*, and PR5*b* connected in parallel to each other. Accordingly, the thickness of the first support substrate 81 can be set to a thickness suitable for one of the division resonators, and the thickness of the second support substrate 82 can be set to a thickness suitable for the other of the division resonators. Therefore, it is possible to reduce or prevent the deterioration of the frequency characteristics of the acoustic wave device due to the ripple.

As a preferable example embodiment, the first resonator includes the plurality of serial arm resonators SR5 to SR7 connected in series, and the second resonator includes the plurality of parallel arm resonators PR6 to PR9 connected in parallel. Accordingly, the thickness of the first support substrate 81 can be set to a thickness suitable for the serial arm resonators SR5 to SR7, and the thickness of the second support substrate 82 can be set to a thickness suitable for the parallel arm resonators PR6 to PR9. Therefore, it is possible to reduce or prevent the deterioration of the frequency characteristics of the acoustic wave device due to the ripple.

In addition, at least one of the serial arm resonators may include a plurality of division resonators connected in series to each other. Even in this case, it is possible to reduce or prevent the deterioration of the frequency characteristics of the acoustic wave device due to the ripple.

In addition, at least one of the parallel arm resonators may include a plurality of division resonators connected in parallel to each other. Even in this case, it is possible to reduce or prevent of the deterioration the frequency characteristics of the acoustic wave device due to the ripple.

As a preferable example embodiment, the first support substrate 81 and the second support substrate 82 each include silicon. Accordingly, it is possible to reduce or prevent the deterioration of the frequency characteristics of the acoustic wave device due to the ripple.

In addition, the first support portion may further include a first intermediate layer on the first piezoelectric layer 21 side of the first support substrate 81, and the second support portion may further include a second intermediate layer on the second piezoelectric layer 22 side of the second support substrate 82. Even in this case, it is possible to reduce or prevent the deterioration of the frequency characteristics of the acoustic wave device due to the ripple.

In addition, the first intermediate layer and the second intermediate layer may have different thicknesses. Even in this case, it is possible to reduce or prevent the deterioration of the frequency characteristics of the acoustic wave device due to the ripple.

In addition, the main surface (second main surface 81*b*) of the first support substrate 81 opposite to the main surface on the first piezoelectric layer 21 side in the first direction and the main surface (second main surface 82*b*) of the second support substrate 82 opposite to the main surface on the second piezoelectric layer 22 side in the first direction may have different surface roughnesses. Even in this case, it is possible to reduce or prevent the deterioration of the frequency characteristics of the acoustic wave device due to the ripple.

As a preferable example embodiment, the first support substrate 81 has a thickness greater than the second support substrate 82, and the main surface of the first support substrate 81 opposite to the main surface on the first piezoelectric layer 21 side in the first direction has a surface roughness greater than the main surface of the second support substrate 82 opposite to the main surface on the second piezoelectric layer 22 side in the first direction. Accordingly, spurious waves generated in and out of the band due to substrate reflection can be further reduced.

As a preferable example embodiment, the second support substrate 82 has a thickness greater than the first support substrate 81, and the main surface of the second support substrate 82 opposite to the main surface on the second piezoelectric layer 22 side in the first direction has a surface roughness greater than the main surface of the first support substrate 81 opposite to the main surface on the first piezoelectric layer 21 side in the first direction. Accordingly, spurious waves generated in and out of the band due to substrate reflection can be further reduced.

In addition, the first piezoelectric layer 21 and the second piezoelectric layer 22 may have different thicknesses. Even in this case, it is possible to reduce or prevent the deterioration of the frequency characteristics of the acoustic wave device due to the ripple.

As a preferable example embodiment, the first support substrate 81 has a thickness greater than the second support substrate 82, and the first piezoelectric layer 21 has a thickness smaller than the second piezoelectric layer 22. Accordingly, since the deformation of the first support substrate 81 is small, the deformation of the first piezoelectric layer 21 can also be small, and the deformation of the first piezoelectric layer 21 can be reduced or prevented.

As a preferable example embodiment, the second support substrate 82 has a thickness greater than the first support substrate 81, and the second piezoelectric layer 22 has a thickness smaller than the first piezoelectric layer 21. Accordingly, since the deformation of the second support substrate 82 is small, the deformation of the second piezoelectric layer 22 can also be small, and the deformation of the second piezoelectric layer 22 can be reduced or prevented.

As a preferable example embodiment, the functional electrode 31A, 31B, 32A, 32B includes one or more first electrode fingers 3 extending in the second direction that intersects the first direction and one or more second electrode fingers 4 each facing corresponding one of the one or more first electrode fingers 3 in the third direction orthogonal to the second direction and extending in the second direction. Accordingly, the acoustic wave device can be reduced in size, and the Q value can be increased.

As a preferable example embodiment, the shield electrode 60A, 60B that covers the functional electrode 31A, 31B of the first resonator R1A, R1B or the functional electrode 32A, 32B of the second resonator R2A, R2B is further included. Accordingly, it is possible to reduce or prevent the deterioration of the frequency characteristics of the other resonator by the leakage waves generated by the operation of one resonator among the first resonators R1A and R1B and the second resonators R2A and R2B.

As a preferable example embodiment, the through electrode 57A, 57B that passes through the first support substrate 81 is further included. One end portion of the through electrode 57A, 57B in the first support substrate 81 is electrically connected to the first resonator R1A, R1B, and the other end portion of the through electrode 57A, 57B in the first support substrate 81 is connected to the outer electrode 58A, 58B. As a result, the heat dissipation properties of the first resonators R1A and R1B can be improved.

As a preferable example embodiment, the through electrode 57A, 57B that passes through the second support substrate 82, one end portion of the through electrode 57A, 57B in the second support substrate 82 is electrically connected to the second resonator R2A, R2B, and the other end portion in the first direction of the through electrode 57A, 57B in the second support substrate 82 is connected to the outer electrode 58A, 58B. As a result, the heat dissipation properties of the second resonators R2A and R2B can be improved.

As a preferable example embodiment, the functional electrode 31A, 31B, 32A, 32B includes one or more first electrode fingers 3 extending in the second direction that intersects the first direction and one or more second electrode fingers 4 each facing corresponding one of the one or more first electrode fingers 3 in the third direction orthogonal to the second direction and extending in the second direction. The thickness of the first piezoelectric layer 21 or the thickness of the second piezoelectric layer 22 is 2 p or less, when p is the center-to-center distance between the adjacent first electrode finger 3 and second electrode finger 4. As a result, it is possible to effectively excite the bulk wave of the first-order thickness shear mode.

The first piezoelectric layer 21 or the second piezoelectric layer 22 preferably contains lithium niobate or lithium tantalate. Accordingly, an acoustic wave device in which good resonance characteristics are obtained can be provided.

As a preferable example embodiment, a bulk wave in a thickness shear mode can be used. Accordingly, an acoustic wave device in which the coupling coefficient increases and good resonance characteristics are obtained can be provided.

As a preferable example embodiment, the functional electrode 31A, 31B, 32A, 32B includes one or more first electrode fingers 3 extending in the second direction that intersects the first direction and one or more second electrode fingers 4 each facing corresponding one of the one or more first electrode fingers 3 in the third direction orthogonal to the second direction and extending in the second direction. $d/p \leq$ about 0.5 is satisfied, where d is the thickness of the first piezoelectric layer 21 or the thickness of the second piezoelectric layer 22 and p is the center-to-center distance between the adjacent first electrode finger 3 and second electrode finger 4 among the one or more first electrode fingers 3 and the one or more second electrode fingers 4. As a result, it is possible to effectively excite the bulk wave of the first-order thickness shear mode.

As a preferable example embodiment, d/p is about 0.24 or less. As a result, it is possible to effectively excite the bulk wave of the first-order thickness shear mode.

As a preferable example embodiment, the functional electrode 31A, 31B, 32A, 32B includes one or more first electrode fingers 3 extending in the second direction that intersects the first direction and one or more second electrode fingers 4 each facing corresponding one of the one or more first electrode fingers 3 in the third direction orthogonal to the second direction and extending in the second direction. MR≤ about 1.75 (d/p)+0.075 is satisfied, when a region where the adjacent first electrode finger 3 and second electrode finger 4 overlap each other when viewed in the facing direction of the first electrode finger 3 and the second electrode finger 4 is an excitation region, and when MR is a metallization ratio of the one or more first electrode fingers 3 and the one or more second electrode fingers 4 to the excitation region. As a result, it is possible to effectively reduce the spurious waves.

As a preferable example embodiment, a plate wave can be used. Accordingly, an acoustic wave device in which good resonance characteristics are obtained can be provided.

As example a preferable embodiment, the first piezoelectric layer 21 and the second piezoelectric layer 22 are made of lithium niobate or lithium tantalate. Euler angles (φ, θ, Ω) of the lithium niobate or the lithium tantalate are in a range of Formula (1), Formula (2), or Formula (3) below. In this case, the fractional band can be reliably set to about 17% or less.

$$(0° \pm 10°,\ 0° \text{ to } 20°,\ \text{any } \psi) \quad \text{Formula (1)}$$

$$(0° \pm 10°,\ 20° \text{ to } 80°,\ 0° \text{ to } 60°(1-(\theta-50)^2/900)^{1/2}) \text{ or } (0° \pm 10°,\ 20° \text{ to } 80°,\ [180° - 60°(1-(\theta-50)^2/900)^{1/2}] \text{ to } 180°) \quad \text{Formula (2)}$$

$$(0° \pm 10°,\ [180° - 30°(1-(\psi-90)^2/8100)^{1/2}] \text{ to } 180°,\ \text{any } \psi) \quad \text{Formula (3)}$$

Hereinafter, a composite filter device including an acoustic wave device according to the first example embodiment will be described.

Figure 18:
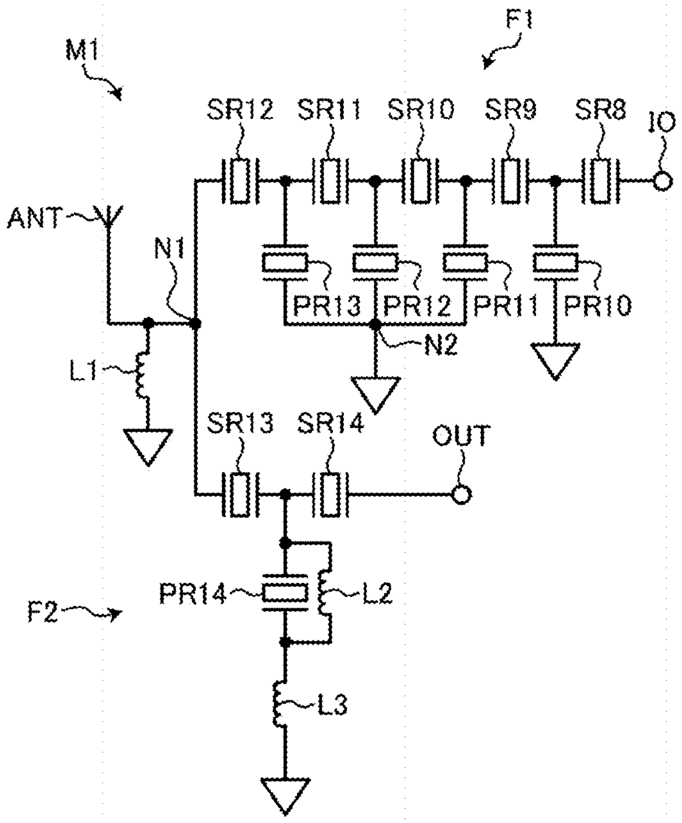
FIG. 18 is a circuit diagram of a composite filter device according to an example embodiment of the present invention.

FIG. 18 is a circuit diagram of the composite filter device according to an example embodiment of the present invention. A composite filter device M1 includes an antenna terminal N1 connected to the antenna ANT. One end of a first acoustic wave device F1 and one end of a second acoustic wave device F2 are connected in common to the antenna terminal N1. An inductor L1 is connected between the antenna terminal N1 and the ground. The inductor L1 is provided to achieve impedance matching.

The composite filter device M1 according to FIG. 18 is preferably a multiplexer. The multiplexer is a device that divides and/or combines high-frequency signals in a plurality of frequency bands directly below one antenna. In the example in FIG. 18, the composite filter device M1 has a configuration in which the acoustic wave devices F1 and F2 are connected in common to the antenna terminal N1 as the plurality of filters having the pass bands in the respective frequency bands. As a result, it is possible to correspond to a plurality of frequency bands (multibands).

Here, the composite filter device M1 is an example of the example embodiment of the composite filter device according to the present invention, but the first acoustic wave device F1 or the second acoustic wave device F2 in the composite filter device M1 is also an example of an example embodiment of an acoustic wave device according to the present invention. That is, any one of the first acoustic wave device F1 or the second acoustic wave device F2 is a modified example of an acoustic wave device according to an example embodiment.

The first acoustic wave device F1 is, for example, preferably a filter through which a WiFi (registered trademark) band passes, and has a pass band of about 2401 MHz or more and about 2483 MHz or less. The first acoustic wave device F1 includes an input/output terminal IO. The serial arm connecting the input/output terminal IO and the antenna terminal N1 is provided with serial arm resonators SR8 to SR12. In addition, the parallel arm resonator PR10 is connected between the connection point between the serial arm resonator S8 and the serial arm resonator S9 and the ground. The parallel arm resonator PR11 is connected between the connection point between the serial arm resonator SR9 and the serial arm resonator SR10 and the ground. The parallel arm resonator PR12 is connected between the connection point between the serial arm resonator SR10 and the serial arm resonator SR11 and the ground. The parallel arm resonator PR13 is connected between the connection point between the serial arm resonator SR11 and the serial arm resonator SR12 and the ground. The end portions of the parallel arm resonators PR11 to PR13 on the ground side are connected in common to a common terminal N2 and are connected to the ground. The first acoustic wave device F1 is a ladder filter having the above-described circuit configuration. Here, the serial arm resonators SR8 to SR12 and the parallel arm resonators PR10 to P13 are the resonators of the acoustic wave device.

The second acoustic wave device F2 is, for example, preferably a notch filter that allows a middle band and a high band cellular band to pass therethrough and attenuates a WiFi band, and has bands of about 1710 MHz or more and about 2200 MHz or less and about 2496 MHz or more and about 2690 MHz or less as pass bands. The second acoustic wave device F2 is connected between the antenna terminal N1 and the output terminal OUT. The second acoustic wave device F2 includes serial arm resonators SR13 and SR14. The parallel arm resonator PR14 is connected between the connection point between the serial arm resonator SR13 and the serial arm resonator SR14 and the ground. The inductor L2 is connected in parallel to the parallel arm resonator PR14. In addition, the inductor L3 is connected between the end portion of the parallel arm resonator PR14 on the ground side and the ground. Here, the serial arm resonators SR13 and SR14 and the parallel arm resonator PR14 are resonators included in the acoustic wave device.

In addition, the first acoustic wave device F1 is a WiFi filter, but may be another band-pass type filter, and may be, for example, a global positioning system (GPS) filter that allows a GPS signal to pass and attenuates other cellular band signals.

In addition, the composite filter device according can be applied to various multiplexers or composite filter devices in which three or more band-pass filters are connected in common, and the pass bands thereof are not limited.

Figure 19:
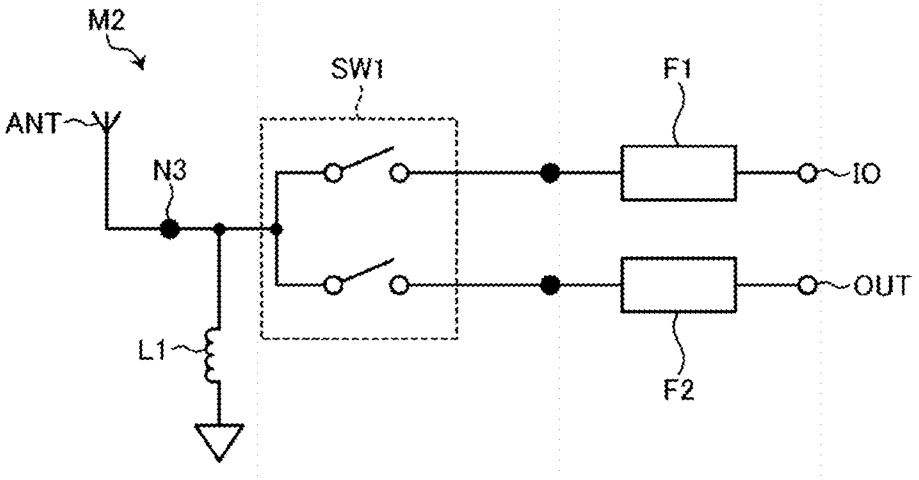
FIG. 19 is a circuit diagram illustrating a modified example of an composite filter device according to an example embodiment of the present invention.

FIG. 19 is a circuit diagram illustrating a modified example of the composite filter device according to the above-described example embodiment. In the composite filter device M2 illustrated in FIG. 19, the first acoustic wave device F1 and the second acoustic wave device F2 are connected in common as a plurality of acoustic wave devices to the antenna terminal N1 connected to the antenna ANT via the switch SW1. As described above, out of the first acoustic wave device F1 and the second acoustic wave device F2 connected in common via the switch SW1, at least one may be the acoustic wave device according to the first example embodiment.

As described above, the composite filter device M1 according to the above-described example embodiment includes the acoustic wave device according to the first example embodiment which is connected to the antenna terminal N1 connected to the antenna ANT, and at least one acoustic wave device that is connected in common to the antenna terminal N1. In the acoustic wave device according to the first example embodiment, since the deterioration of the frequency characteristics of the acoustic wave device due to the ripple is reduced or prevented, the filter characteristics can be improved.

In addition, the composite filter device M1 may be a multiplexer. In this case, it is possible to correspond to a plurality of frequency bands (multibands).

In addition, the composite filter device M2 according to the above-described example embodiment includes the plurality of acoustic wave devices F1 and F2 connected in common to the antenna terminal N3 connected to the antenna ANT via the switch SW1, and at least one of the plurality of acoustic wave devices F1 and F2 may be the acoustic wave device according to the first example embodiment. In the acoustic wave device according to the first example embodiment, since the deterioration of the frequency characteristics of the acoustic wave device due to the ripple is reduced or prevented, the filter characteristics can be improved.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a first piezoelectric layer including a first main surface and a second main surface opposite to the first main surface in a first direction;

a first support portion including a first support substrate that overlaps the first piezoelectric layer in the first direction;

a first resonator provided on at least the first main surface of the first piezoelectric layer;

a second piezoelectric layer including a third main surface and a fourth main surface opposite to the third main surface in the first direction;

a second support portion including a second support substrate that overlaps the second piezoelectric layer in the first direction; and a second resonator provided on at least the third main surface of the second piezoelectric layer; wherein the first resonator and the second resonator each include a functional electrode;

the first support portion includes a first space portion that overlaps at least a portion of the functional electrode of the first resonator in a plan view in the first direction;

the second support portion includes a second space portion that overlaps at least a portion of the functional electrode of the second resonator in the plan view in the first direction;

a thickness of a portion of the first support portion that overlaps the first space portion is less than a portion of the first support portion that does not overlap the first space portion;

a thickness of a portion of the second support portion that overlaps the second space portion is less than a portion of the second support portion that does not overlap the second space portion;

a main surface of the first support substrate on a first piezoelectric layer side and a main surface of the second support substrate on a second piezoelectric layer side oppose each other in the first direction;

the first resonator and the second resonator are electrically connected by a conductive joining portion extending in the first direction;

a space between the first support substrate and the second support substrate is sealed by a sealing portion; and the first support substrate and the second support substrate have different thicknesses.

2. The acoustic wave device according to claim 1, wherein the first resonator and the second resonator are division resonators connected in series to each other.

3. The acoustic wave device according to claim 1, wherein the first resonator and the second resonator are division resonators connected in parallel to each other.

4. The acoustic wave device according to claim 1, wherein the first resonator includes a plurality of serial arm resonators connected in series; and the second resonator includes a plurality of parallel arm resonators connected in parallel.

5. The acoustic wave device according to claim 4, wherein at least one of the serial arm resonators includes a plurality of division resonators connected in series to each other.

6. The acoustic wave device according to claim 4, wherein at least one of the parallel arm resonators includes a plurality of division resonators connected in parallel to each other.

7. The acoustic wave device according to claim 1, wherein the first support substrate and the second support substrate each include silicon.

8. The acoustic wave device according to claim 1, wherein the first support portion further includes a first intermediate layer on the first piezoelectric layer side of the first support substrate; and the second support portion further includes a second intermediate layer on the second piezoelectric layer side of the second support substrate.

9. The acoustic wave device according to claim 8, wherein the first intermediate layer and the second intermediate layer have different thicknesses.

10. The acoustic wave device according to claim 1, wherein a main surface of the first support substrate opposite to the main surface on the first piezoelectric layer side in the first direction and a main surface of the second support substrate opposite to the main surface on the second piezoelectric layer side in the first direction have different surface roughnesses.

11. The acoustic wave device according to claim 10, wherein the first support substrate has a thickness greater than the second support substrate; and the main surface of the first support substrate opposite to the main surface on the first piezoelectric layer side in the first direction has a surface roughness greater than the main surface of the second support substrate opposite to the main surface on the second piezoelectric layer side in the first direction.

12. The acoustic wave device according to claim 10, wherein the second support substrate has a thickness greater than the first support substrate; and the main surface of the second support substrate opposite to the main surface on the second piezoelectric layer side in the first direction has a surface roughness greater than the main surface of the first support substrate opposite to the main surface on the first piezoelectric layer side in the first direction.

13. The acoustic wave device according to claim 1, wherein the first piezoelectric layer and the second piezoelectric layer have different thicknesses.

14. The acoustic wave device according to claim 1, wherein the first support substrate has a thickness greater than the second support substrate; and the first piezoelectric layer has a thickness smaller than the second piezoelectric layer.

15. The acoustic wave device according to claim 1, wherein the second support substrate has a thickness greater than the first support substrate; and the second piezoelectric layer has a thickness smaller than the first piezoelectric layer.

16. The acoustic wave device according to claim 1, wherein the functional electrode includes one or more first electrode fingers extending in a second direction that intersects the first direction and one or more second electrode fingers each facing corresponding one of the one or more first electrode fingers in a third direction orthogonal to the second direction and extending in the second direction.

17. The acoustic wave device according to of claim 1, further comprising a shield electrode covering the functional electrode of the first resonator or the functional electrode of the second resonator.

18. The acoustic wave device according to claim 1, further comprising:

a through electrode passing through the first support substrate; wherein one end portion of the through electrode in the first support substrate is electrically connected to the first resonator, and another end portion of the through electrode in the first support substrate is connected to an outer electrode.

19. The acoustic wave device according to claim 1, further comprising:

a through electrode passing through the second support substrate; wherein one end portion of the through electrode in the second support substrate is electrically connected to the second resonator, and another end portion of the through electrode in the second support substrate is connected to an outer electrode.

20. The acoustic wave device according to claim 1, wherein the functional electrode includes one or more first electrode fingers extending in a second direction that intersects the first direction and one or more second electrode fingers each facing corresponding one of the one or more first electrode fingers in a third direction orthogonal or substantially orthogonal to the second direction and extending in the second direction; and a thickness of the first piezoelectric layer or a thickness of the second piezoelectric layer is about 2 p or less, when p is a center-to-center distance between a first electrode finger and a second electrode finger adjacent to each other.

21. The acoustic wave device according to claim 1, wherein the first piezoelectric layer or the second piezoelectric layer includes lithium niobate or lithium tantalate.

22. The acoustic wave device according to claim 1, wherein the acoustic wave device is structured to generate a bulk wave in a thickness shear mode.

23. The acoustic wave device according to claim 1, wherein the functional electrode includes one or more first electrode fingers extending in a second direction that intersects the first direction and one or more second electrode fingers each opposing corresponding one of the one or more first electrode fingers in a third direction orthogonal or substantially orthogonal to the second direction and extending in the second direction; and $d/p \leq$ about 0.5 is satisfied, where d is a thickness of the first piezoelectric layer or a thickness of the second piezoelectric layer and p is a center-to-center distance between a first electrode finger and a second electrode finger adjacent to each other among the one or more first electrode fingers and the one or more second electrode fingers.

24. The acoustic wave device according to claim 23, wherein d/p is about 0.24 or less.

25. The acoustic wave device according to claim 1, wherein the functional electrode includes one or more first electrode fingers extending in a second direction that intersects the first direction and one or more second electrode fingers each facing corresponding one of the one or more first electrode fingers in a third direction orthogonal to the second direction and extending in the second direction; and $MR \leq$ about $1.75(d/p)+0.075$ is satisfied, when a region where a first electrode finger and a second electrode finger adjacent to each other overlap each other when viewed in an opposing direction of the first electrode finger and the second electrode is an excitation region, and when MR is a metallization ratio of the one or more first electrode fingers and the one or more second electrode fingers to the excitation region.

26. The acoustic wave device according to claim 1, wherein the acoustic wave device is structured to generate a plate wave.

27. The acoustic wave device according to claim 1, wherein the first piezoelectric layer and the second piezoelectric layer are made of lithium niobate or lithium tantalate.

28. The acoustic wave device according to claim 27, wherein

Euler angles (φ, θ, Ω) of the lithium niobate or the lithium tantalate are in a range of at least one of the formulas:

$$(0^\circ \pm 10^\circ, 0^\circ \text{ to } 20^\circ, \text{any } \psi);$$

$$\left(0^\circ \pm 10^\circ, 20^\circ \text{ to } 80^\circ, 0^\circ \text{ to } 60^\circ\left(1-(\theta-50)^2/900\right)^{1/2}\right) \text{ or } \left(0^\circ \pm 10^\circ, 20^\circ \text{ to } 80^\circ, \left[180^\circ-60^\circ\left(1-(\theta-50)^2/900\right)^{1/2}\right] \text{ to } 180^\circ\right); \text{ and}$$

$$\left(0^\circ \pm 10^\circ, \left[180^\circ - 30^\circ\left(1-(\psi-90)^2/8100\right)^{1/2}\right] \text{ to } 180^\circ, \text{any } \psi\right).$$

29. A composite filter device comprising:

the acoustic wave device according to claim 1 connected to an antenna terminal connected to an antenna; and at least one acoustic wave device connected in common to the antenna terminal.

30. The composite filter device according to claim 29, wherein the composite filter device is a multiplexer.

31. A composite filter device comprising:

a plurality of acoustic wave devices connected in common to an antenna terminal connected to an antenna via a switch; wherein at least one of the plurality of acoustic wave devices is the acoustic wave device according to claim 1.

* * * * *